US011328754B2

(12) United States Patent
Lien et al.

(10) Patent No.: US 11,328,754 B2
(45) Date of Patent: *May 10, 2022

(54) PRE-CHARGE TIMING CONTROL FOR PEAK CURRENT BASED ON DATA LATCH COUNT

(71) Applicant: WESTERN DIGITAL TECHNOLOGIES, INC., San Jose, CA (US)

(72) Inventors: Yu-Chung Lien, San Jose, CA (US); Juan Lee, Sunnyvale, CA (US); Huai-Yuan Tseng, San Ramon, CA (US)

(73) Assignee: WESTERN DIGITAL TECHNOLOGIES, INC., San Jose, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/888,095

(22) Filed: May 29, 2020

(65) Prior Publication Data

US 2021/0375339 A1   Dec. 2, 2021

(51) Int. Cl.
*G11C 7/00*   (2006.01)
*G11C 7/12*   (2006.01)
*G11C 7/08*   (2006.01)
*G11C 7/10*   (2006.01)

(52) U.S. Cl.
CPC .............. *G11C 7/12* (2013.01); *G11C 7/08* (2013.01); *G11C 7/106* (2013.01)

(58) Field of Classification Search
CPC ............ G11C 7/12; G11C 7/106; G11C 7/08
USPC ........................................................ 365/203
See application file for complete search history.

(56) References Cited

U.S. PATENT DOCUMENTS

| 6,480,434 B1 | 11/2002 | Lee |
| 6,801,460 B2 | 10/2004 | Fukiage |
| 8,705,288 B2 | 4/2014 | Edahiro |
| 9,230,659 B2 | 1/2016 | Choi et al. |
| 9,536,617 B2 | 1/2017 | Al-Shamma et al. |

(Continued)

FOREIGN PATENT DOCUMENTS

CN   204029386 U   5/2014

OTHER PUBLICATIONS

International Search Report and Written Opinion issued for Int'l Appl No. PCT/US2021/020057, Int'l Filing Date Feb. 26, 2021, dated May 13, 2021.

*Primary Examiner* — Tha-O H Bui
(74) *Attorney, Agent, or Firm* — ArentFox Schiff LLP

(57) ABSTRACT

Aspects of a storage device including a memory and a controller are provided which allow for reduction of current during program operations using pre-charge timing control based on an inhibit bit line count acquired from data latches. When the inhibit bit line count is within a bit line count range, the controller pre-charges bit lines in memory during a first time period to a first target voltage, and when the inhibit bit line count is outside the bit line count range, the controller pre-charges the bit lines during a second, earlier time period to a second, smaller target voltage. The controller is thus configured to reduce current and minimize operation overlaps in the earlier time period during the middle of the program operation where current is highest. Thus, a balance in power consumption and performance may be achieved during program operations using timing control.

17 Claims, 17 Drawing Sheets

(56) References Cited

U.S. PATENT DOCUMENTS

| | | |
|---|---|---|
| 10,559,365 B2 | 2/2020 | Yang et al. |
| 10,839,915 B1 * | 11/2020 | Yang ................... G11C 16/24 |
| 2010/0103740 A1 | 4/2010 | Kwak et al. |
| 2011/0013457 A1 | 1/2011 | Han |
| 2012/0127794 A1 | 5/2012 | Moschiano et al. |
| 2012/0294093 A1 | 11/2012 | Yang |
| 2013/0279258 A1 * | 10/2013 | Lee ...................... G11C 16/30 365/185.17 |
| 2015/0003167 A1 | 1/2015 | Choi et al. |
| 2019/0304549 A1 | 10/2019 | Yang et al. |

\* cited by examiner

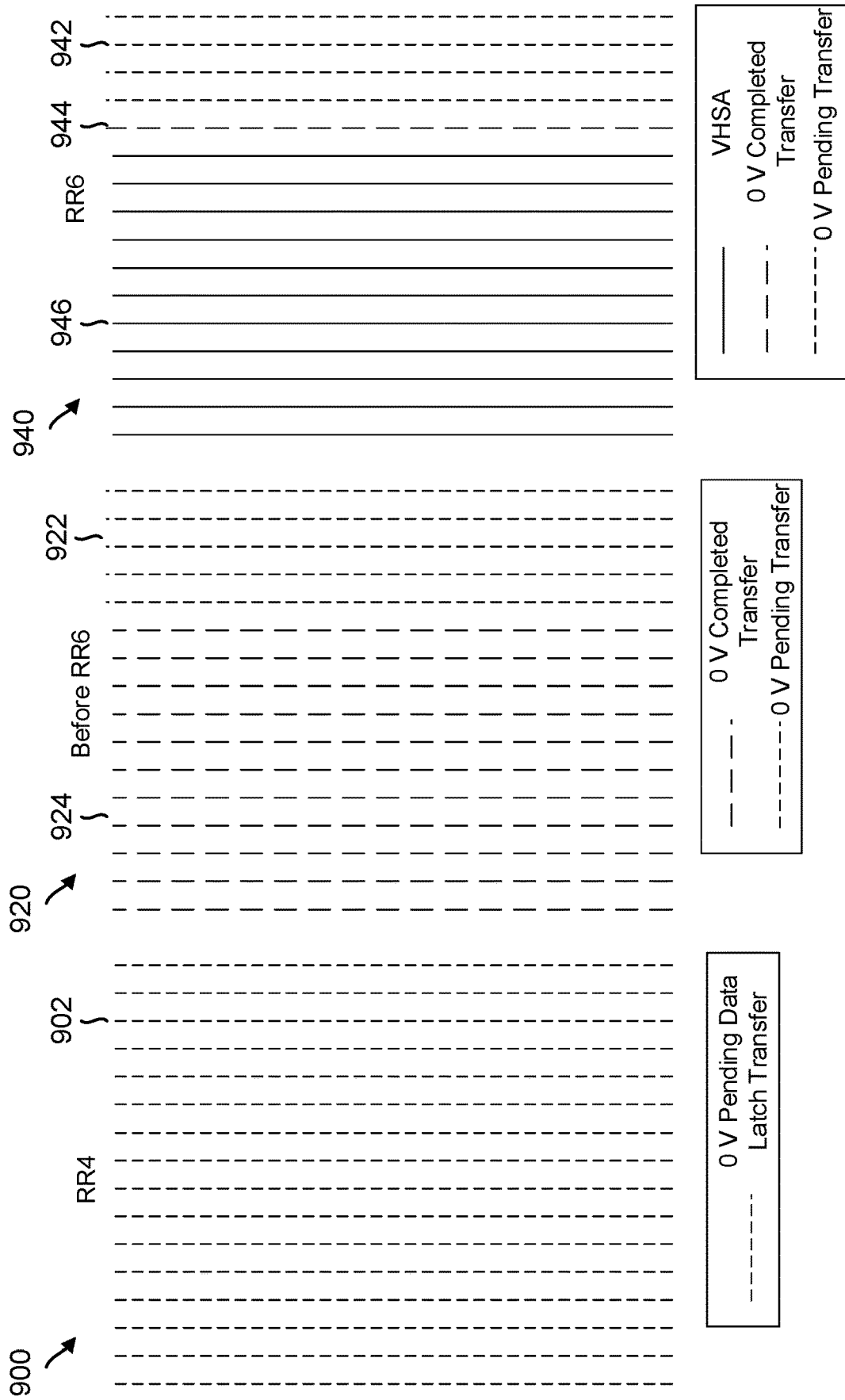

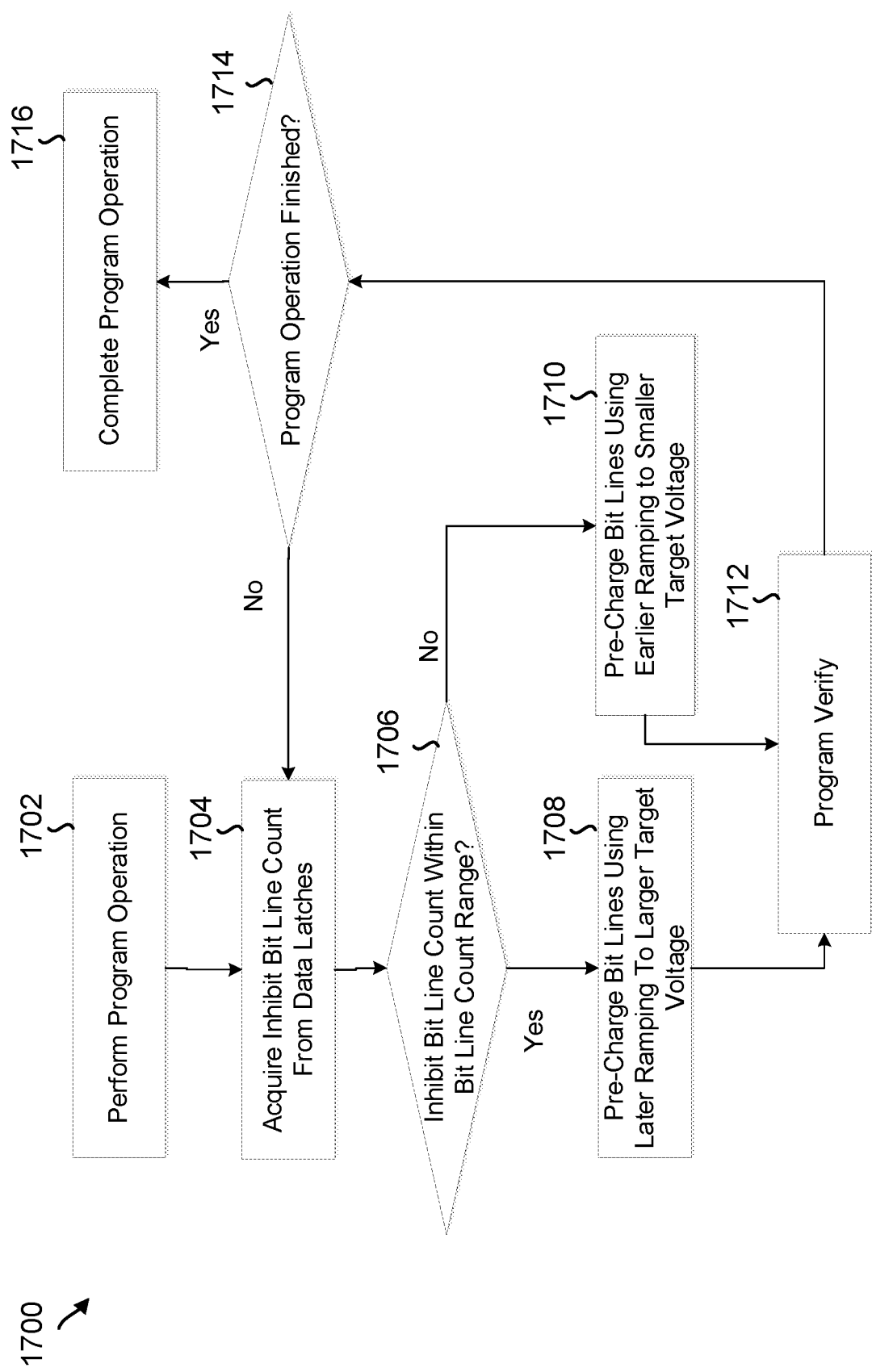

PRE-CHARGE TIMING CONTROL FOR PEAK CURRENT BASED ON DATA LATCH COUNT

BACKGROUND

Field

This disclosure is generally related to electronic devices and more particularly to storage devices.

Background

Storage devices enable users to store and retrieve data. Examples of storage devices include non-volatile memory devices. A non-volatile memory generally retains data after a power cycle. An example of a non-volatile memory is a flash memory, which may include array(s) of NAND cells on one or more dies. Flash memory may be found in solid-state devices (SSDs), Secure Digital (SD) cards, and the like.

A flash storage device may store control information associated with data. For example, a flash storage device may maintain control tables that include a mapping of logical addresses to physical addresses. This control tables are used to track the physical location of logical sectors, or blocks, in the flash memory. The control tables are stored in the non-volatile memory to enable access to the stored data after a power cycle.

When writing data to cells of the flash memory, the flash storage device may identify the physical address of a block associated with a logical address, and may then apply a program voltage to a word line of the block at the identified physical address to program the data into the cells coupled to that word line. Applying the program voltage to the word line may result in a current (Icc) which flows along a bit line coupled the cells and whose average and peak values may impact the life of the flash memory. For example, a small average Icc may result in more sustainable flash memories, and a small peak Icc may maintain voltages at reasonable levels in order to allow the flash storage device to function properly. As flash storage devices generally provide a fixed amount of power, a large peak or average Icc may cause voltages to drop to an extent affecting the device's functionality.

SUMMARY

One aspect of a storage device is disclosed herein. The storage device includes a memory and a controller. The memory comprises a plurality of bit lines. The controller is configured to pre-charge the bit lines during a first time period when an inhibit bit line count acquired during a program operation is within a bit line count range, and to pre-charge the bit lines during a second time period different than the first time period when the inhibit bit line count is outside the bit line count range.

Another aspect of a storage device is disclosed herein. The storage device includes a memory and a controller. The memory comprises a plurality of bit lines. The controller is configured to pre-charge the bit lines to a first target voltage when an inhibit bit line count acquired during a program operation is within a bit line count range, and to pre-charge the bit lines to a second target voltage different than the first target voltage when the inhibit bit line count is outside the bit line count range, wherein the bit lines are pre-charged during one of a plurality of time periods based on the inhibit bit line count.

A further aspect of a storage device is disclosed herein. The storage device includes a memory and a controller. The memory comprises a plurality of bit lines. The controller is configured to pre-charge the bit lines during a first time period to a first target voltage when an inhibit bit line count acquired during a program operation is within a bit line count range, and to pre-charge the bit lines during a second time period different than the first time period to a second target voltage smaller than the first target voltage when the inhibit bit line count is outside the bit line count range.

It is understood that other aspects of the storage device will become readily apparent to those skilled in the art from the following detailed description, wherein various aspects of apparatuses and methods are shown and described by way of illustration. As will be realized, these aspects may be implemented in other and different forms and its several details are capable of modification in various other respects. Accordingly, the drawings and detailed description are to be regarded as illustrative in nature and not as restrictive.

BRIEF DESCRIPTION OF THE DRAWINGS

Various aspects of the present invention will now be presented in the detailed description by way of example, and not by way of limitation, with reference to the accompanying drawings, wherein:

FIGS. 9A-9C are conceptual diagrams illustrating an example arrangement of bit lines coupled to data latches awaiting transfer of write data while other bit lines are pre-charged.

FIG. 17 is a flow chart illustrating a method for reducing peak current from bit line pre-charging at different time periods and target voltages based on data latch counts as performed by the storage device of FIG. 1.

DETAILED DESCRIPTION

Figure 1:
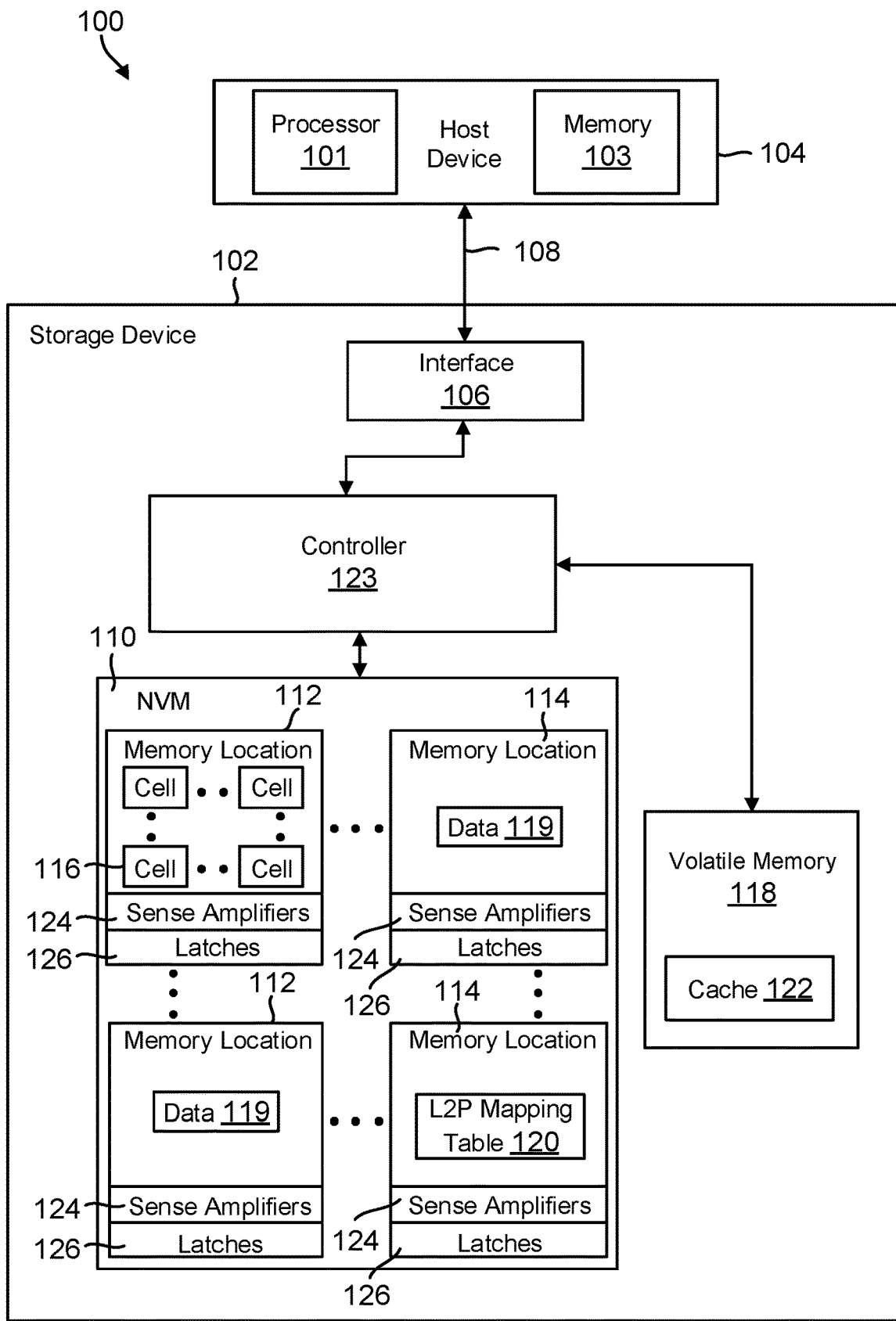
FIG. 1 is a block diagram illustrating an exemplary embodiment of a storage device in communication with a host device.

The detailed description set forth below in connection with the appended drawings is intended as a description of various exemplary embodiments of the present invention and is not intended to represent the only embodiments in which the present invention may be practiced. The detailed description includes specific details for the purpose of providing a thorough understanding of the present invention. However, it will be apparent to those skilled in the art that the present invention may be practiced without these specific details. In some instances, well-known structures and components are shown in block diagram form in order to avoid obscuring the concepts of the present invention. Acronyms and other descriptive terminology may be used merely for convenience and clarity and are not intended to limit the scope of the invention.

The words "exemplary" and "example" are used herein to mean serving as an example, instance, or illustration. Any exemplary embodiment described herein as "exemplary" is not necessarily to be construed as preferred or advantageous over other exemplary embodiments. Likewise, the term "exemplary embodiment" of an apparatus, method or article of manufacture does not require that all exemplary embodiments of the invention include the described components, structure, features, functionality, processes, advantages, benefits, or modes of operation.

As used herein, the term "coupled" is used to indicate either a direct connection between two components or, where appropriate, an indirect connection to one another through intervening or intermediate components. In contrast, when a component referred to as being "directly coupled" to another component, there are no intervening elements present.

In the following detailed description, various aspects of a storage device in communication with a host device will be presented. These aspects are well suited for flash storage devices, such as SSDs and SD cards. However, those skilled in the art will realize that these aspects may be extended to all types of storage devices capable of storing data. Accordingly, any reference to a specific apparatus or method is intended only to illustrate the various aspects of the present invention, with the understanding that such aspects may have a wide range of applications without departing from the spirit and scope of the present disclosure.

When a controller of the storage device writes data into cells of memory during a program operation, the voltages of the bit lines coupled to those cells may ramp up or down depending on whether the cells are selected for programming. For example, during a pre-charge phase prior to programming, the voltage of a bit line that is coupled to an unselected cell may be ramped up (e.g. to a high voltage such as VHSA) to inhibit or prevent subsequent programming of that cell, while the voltage of a bit line that is coupled to a selected cell may be ramped down (e.g. to a low voltage such as ground) to enable subsequent programming of that cell. The controller may control the voltage ramping rate of bit lines to VHSA, for example, based on a current limiting parameter VHSASLOW or another name. The controller may also control the target voltage (e.g. a percentage of VHSA) to which the bit line may be pre-charged at the controlled ramping rate, for example, based on a target voltage parameter VHSATGT or another name. Moreover, each bit line may be pre-charged based on an output of a data latch coupled to the bit line. For example, if a data latch outputs one logical value (e.g. 0 or 1), the bit line may be discharged to a low voltage to enable programming of a cell, while if the data latch outputs another logical value (e.g. 1 or 0), the bit line may be pre-charged to a high voltage to inhibit programming of the cell.

However, such inhibiting of the bit lines may result in higher peak and average current during the middle of the program operation than during the beginning and end of the program operation. For example, during a program operation, bit lines coupled to programmed cells may be inhibited (pre-charged) to prevent further programming of those cells while the cells coupled to other bit lines are still being programmed. Thus, as the program operation is being performed, the number of inhibited bit lines may increase while the number of selected bit lines may decrease. Accordingly, a more even distribution of selected and un-selected bit lines may exist during the middle of the program operation than during the beginning of the program operation (i.e. where there may be fewer programmed cells and thus more selected bit lines) and during the end of the program operation (i.e. where there may be more programmed cells and thus fewer selected bit lines). As a result, a greater number of inter-bit line capacitances between selected and un-selected bit lines may exist during the middle of the program operation than during the beginning and end, resulting in higher currents along the bit lines at this time. When added on top of the increased current that may result from fast voltage ramping rates (e.g. based on VHSASLOW) and small target voltages (e.g. based on VHSATGT), such currents may result in significant voltage drops to maintain the fixed power provided in the storage device, impacting the write performance of the device.

Furthermore, a program operation may include multiple sequences of programming phases, program verify phases and channel clean phases. During each programming phase, un-selected bit lines may be pre-charged and cells of selected bit lines may be subsequently programmed. During each program verify phase, cells of selected bit lines may be read to determine whether the previous programming phase was successful. During each channel clean phase, bit line voltages may be discharged and write data may be transferred to the data latches in advance of a next programming phase. To improve program time, bit line pre-charging or inhibiting may be configured to occur during a previous channel clean phase rather than during a current programming phase, for example, based on a dynamic inhibit enable indicator (e.g. DYNAMIC_INH or another name). However, such bit line inhibiting during the channel clean phase may result in higher peak and average current than during the programming phase. For example, in some cases, write data may not be fully transferred to the data latches before pre-charging begins in the channel clean phase, and thus transfer and pre-charge operations may overlap in time and consequently result in high currents along the bit lines. When added on top of the increased current during the middle of the program operation as described above, the resulting peak and average current may be even more significant during this time.

To reduce the higher peak and average currents resulting from bit line pre-charging during the middle of a program operation, the storage device described in the present disclosure provides ramp rate and timing control based on data latch counts when pre-charging bit lines of unselected cells. A controller of the storage device may send a program operation command to a die, in response to which multiple sequences of programming phases, program verify phases, and channel clean phases may occur until a page of cells spanning multiple bit lines are fully programmed. During each programming phase, a data latch counter in the die acquires an inhibit bit line count. As used herein, an inhibit bit line count represents a count of the total number of outputs from the data latches coupled to the bit lines that result in bit line pre-charging or inhibiting. For example, assume a page of cells on a selected word line is to be programmed with 16 KB of data, where each of the cells is coupled to one of approximately 16,000 bit lines. If during a particular programming phase in the middle of the program operation, the cells coupled to 6,000 of the bit lines have been programmed (and thus each data latch coupled to the 6,000 bit lines outputs a logical value resulting in bit line pre-charging or inhibiting), the data latch counter may acquire an inhibit bit line count of 6,000. This inhibit bit line count is then compared against a bit line count range to determine whether the programming phase is in the middle of the program operation or at the beginning or end of the program operation. For instance, given a configured bit line count range (e.g. between 2,000 and 10,000 inhibited bit lines, or 2000-10000), then an inhibit bit line count within the range (e.g. 6,000) represents a programming phase in the middle of the program operation, while an inhibit bit line count outside the range (e.g. less than 2000 or greater than 10,000) represents a programming phase at the beginning and end of the program operation respectively.

Depending on whether the inhibit bit line count is within or outside the bit line count range, the bit lines of unselected cells may be pre-charged during the programming phase according to different ramp rates, target voltages, and/or timings. For example, if the inhibit bit line count is within the range, the bit lines may be pre-charged at a slower ramp rate (e.g. based on a smaller VHSASLOW value) to a larger target voltage (e.g. based on a larger VHSATGT value) in order to reduce the high peak and average current during the middle of the program operation. Alternatively, the bit lines may be pre-charged to the larger target voltage during the programming phase as opposed to the previous channel clean phase, e.g. based on a disabled DYNAMIC_INH value, in order to further reduce the high current resulting from pre-charging overlap with data latch transfers in the middle of the program operation. However, if the inhibit bit line count is outside the range (where there is less current), the bit lines may be pre-charged at a faster ramp rate (e.g. based on a larger VHSASLOW value) to a smaller target voltage (e.g. based on a smaller VHSATGT value) to speed up the total program time during the beginning and ends of the program operations. Alternatively, the bit lines may be pre-charged to the smaller target voltage during the previous channel clean phase as opposed to the current programming phase, e.g. based on an enabled DYNAMIC_INH value, to further speed up the total program time. After the pre-charging occurs and the cells are programmed, the programmed cells are read in the following program verify phase. When verification is successful and the next write data is transferred to the data latches, the above-described process repeats for subsequent programming phases until the program operation is complete. In this way, a balance of power consumption and write performance of the storage device may be achieved.

FIG. 1 shows an exemplary block diagram 100 of a storage device 102 which communicates with a host device 104 (also "host") according to an exemplary embodiment. The host 104 and the storage device 102 may form a system, such as a computer system (e.g., server, desktop, mobile/laptop, tablet, smartphone, etc.). The components of FIG. 1 may or may not be physically co-located. In this regard, the host 104 may be located remotely from storage device 102. Although FIG. 1 illustrates that the host 104 is shown separate from the storage device 102, the host 104 in other embodiments may be integrated into the storage device 102, in whole or in part. Alternatively, the host 104 may be distributed across multiple remote entities, in its entirety, or alternatively with some functionality in the storage device 102.

Those of ordinary skill in the art will appreciate that other exemplary embodiments can include more or less than those elements shown in FIG. 1 and that the disclosed processes can be implemented in other environments. For example, other exemplary embodiments can include a different number of hosts communicating with the storage device 102, or multiple storage devices 102 communicating with the host(s).

The host device 104 may store data to, and/or retrieve data from, the storage device 102. The host device 104 may include any computing device, including, for example, a computer server, a network attached storage (NAS) unit, a desktop computer, a notebook (e.g., laptop) computer, a tablet computer, a mobile computing device such as a smartphone, a television, a camera, a display device, a digital media player, a video gaming console, a video streaming device, or the like. The host device 104 may include at least one processor 101 and a host memory 103. The at least one processor 101 may include any form of hardware capable of processing data and may include a general purpose processing unit (such as a central processing unit (CPU)), dedicated hardware (such as an application specific integrated circuit (ASIC)), digital signal processor (DSP), configurable hardware (such as a field programmable gate array (FPGA)), or any other form of processing unit configured by way of software instructions, firmware, or the like. The host memory 103 may be used by the host device 104 to store data or instructions processed by the host or data received from the storage device 102. In some examples, the host memory 103 may include non-volatile memory, such as magnetic memory devices, optical memory devices, holographic memory devices, flash memory devices (e.g., NAND or NOR), phase-change memory (PCM) devices, resistive random-access memory (ReRAM) devices, magnetoresistive random-access memory (MRAM) devices, ferroelectric random-access memory (F-RAM), and any other type of non-volatile memory devices. In other examples, the host memory 103 may include volatile memory, such as random-access memory (RAM), dynamic random access memory (DRAM), static RAM (SRAM), and synchronous dynamic RAM (SDRAM (e.g., DDR1, DDR2, DDR3, DDR3L, LPDDR3, DDR4, and the like). The host memory 103 may also include both non-volatile memory and volatile memory, whether integrated together or as discrete units.

The host interface 106 is configured to interface the storage device 102 with the host 104 via a bus/network 108, and may interface using, for example, Ethernet or WiFi, or a bus standard such as Serial Advanced Technology Attachment (SATA), PCI express (PCIe), Small Computer System Interface (SCSI), or Serial Attached SCSI (SAS), among other possible candidates. Alternatively, the host interface 106 may be wireless, and may interface the storage device 102 with the host 104 using, for example, cellular communication (e.g. 5G NR, 4G LTE, 3G, 2G, GSM/UMTS, CDMA One/CDMA2000, etc.), wireless distribution methods through access points (e.g. IEEE 802.11, WiFi, HiperLAN, etc.), Infra Red (IR), Bluetooth, Zigbee, or other Wireless Wide Area Network (WWAN), Wireless Local Area Network (WLAN), Wireless Personal Area Network (WPAN) technology, or comparable wide area, local area, and personal area technologies.

As shown in the exemplary embodiment of FIG. 1, the storage device 102 includes non-volatile memory (NVM) 110 for persistent storage of data received from the host 104. The NVM 110 can include, for example, flash integrated circuits, NAND memory (e.g., single-level cell (SLC) memory, multi-level cell (MLC) memory, triple-level cell (TLC) memory, quad-level cell (QLC) memory, penta-level cell (PLC) memory, or any combination thereof), or NOR memory. The NVM 110 may include a plurality of memory locations 112 which may store system data for operating the storage device 102 or user data received from the host for storage in the storage device 102. For example, the NVM may have a cross-point architecture including a 2-D NAND array of memory locations 112 having n rows and m columns, where m and n are predefined according to the size of the NVM. In the illustrated exemplary embodiment of FIG. 1, each memory location 112 may be a block 114 including multiple cells 116. The cells 116 may be single-level cells, multi-level cells, triple-level cells, quad-level cells, and/or penta-level cells, for example. Other examples of memory locations 112 are possible; for instance, each memory location may be a die containing multiple blocks. Moreover, each memory location may include one or more blocks in a 3-D NAND array. Moreover, the illustrated memory locations 112 may be logical blocks which are mapped to one or more physical blocks.

The storage device 102 also includes a volatile memory 118 that can, for example, include a Dynamic Random Access Memory (DRAM) or a Static Random Access Memory (SRAM). Data stored in volatile memory 118 can include data read from the NVM 110 or data to be written to the NVM 110. In this regard, the volatile memory 118 can include a write buffer or a read buffer for temporarily storing data. While FIG. 1 illustrates the volatile memory 118 as being remote from a controller 123 of the storage device 102, the volatile memory 118 may be integrated into the controller 123.

The memory (e.g. NVM 110) is configured to store data 119 received from the host device 104. The data 119 may be stored in the cells 116 of any of the memory locations 112. As an example, FIG. 1 illustrates data 119 being stored in different memory locations 112, although the data may be stored in the same memory location. In another example, the memory locations 112 may be different dies, and the data may be stored in one or more of the different dies.

Each of the data 119 may be associated with a logical address. For example, the NVM 110 may store a logical-to-physical (L2P) mapping table 120 for the storage device 102 associating each data 119 with a logical address. The L2P mapping table 120 stores the mapping of logical addresses specified for data written from the host 104 to physical addresses in the NVM 110 indicating the location(s) where each of the data is stored. This mapping may be performed by the controller 123 of the storage device. The L2P mapping table may be a table or other data structure which includes an identifier such as a logical block address (LBA) associated with each memory location 112 in the NVM where data is stored. While FIG. 1 illustrates a single L2P mapping table 120 stored in one of the memory locations 112 of NVM to avoid unduly obscuring the concepts of FIG. 1, the L2P mapping table 120 in fact may include multiple tables stored in one or more memory locations of NVM.

Figure 2:
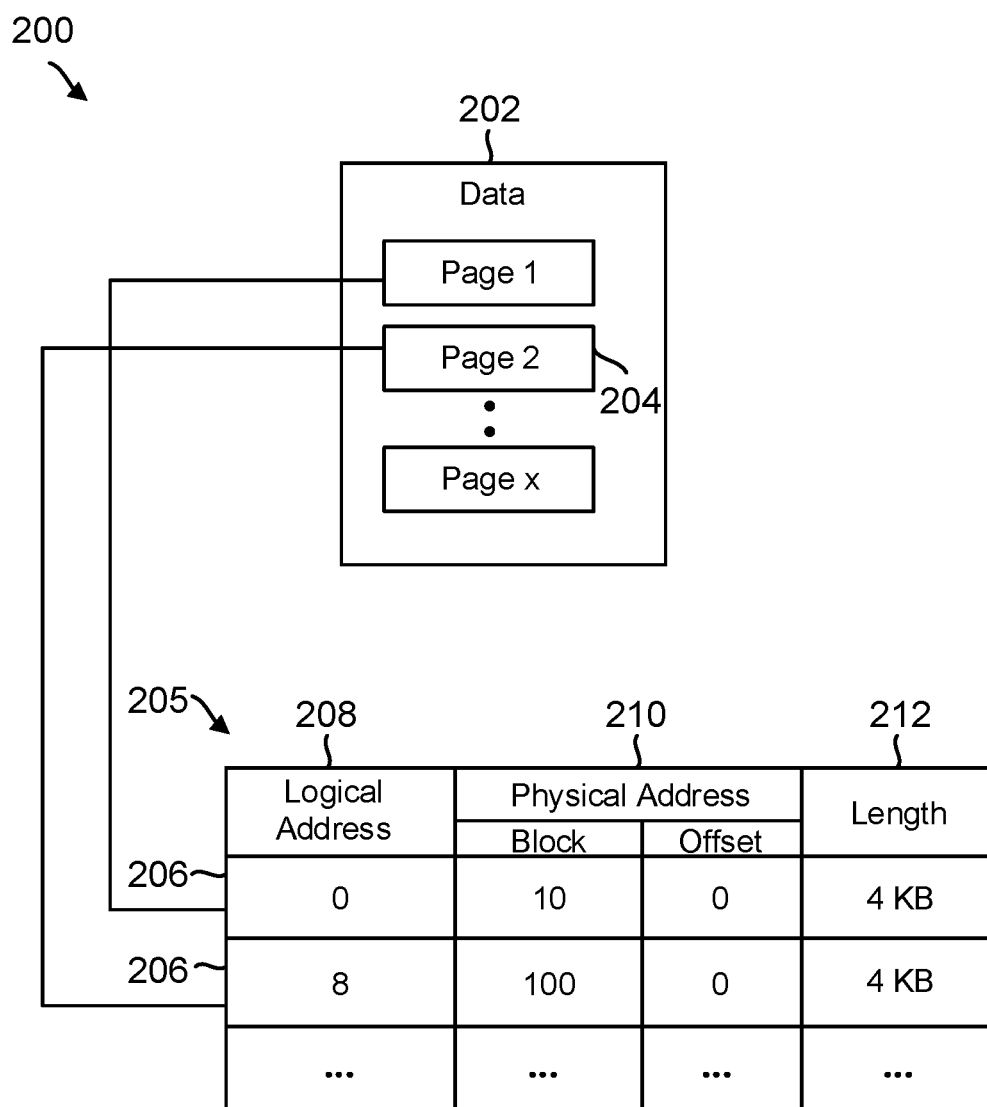
FIG. 2 is a conceptual diagram illustrating an example of a logical-to-physical mapping table in a non-volatile memory of the storage device of FIG. 1.

FIG. 2 is a conceptual diagram 200 of an example of an L2P mapping table 205 illustrating the mapping of data 202 received from a host device to logical addresses and physical addresses in the NVM 110 of FIG. 1. The data 202 may correspond to the data 119 in FIG. 1, while the L2P mapping table 205 may correspond to the L2P mapping table 120 in FIG. 1. In one exemplary embodiment, the data 202 may be stored in one or more pages 204, e.g., pages 1 to x, where x is the total number of pages of data being written to the NVM 110. Each page 204 may be associated with one or more entries 206 of the L2P mapping table 205 identifying a logical block address (LBA) 208, a physical address 210 associated with the data written to the NVM, and a length 212 of the data. LBA 208 may be a logical address specified in a write command for the data received from the host device. Physical address 210 may indicate the block and the offset at which the data associated with LBA 208 is physically written. Length 212 may indicate a size of the written data (e.g. 4 KB or some other size).

Referring back to FIG. 1, the volatile memory 118 also stores a cache 122 for the storage device 102. The cache 122 includes entries showing the mapping of logical addresses specified for data requested by the host 104 to physical addresses in NVM 110 indicating the location(s) where the data is stored. This mapping may be performed by the controller 123. When the controller 123 receives a read command or a write command for data 119, the controller checks the cache 122 for the logical-to-physical mapping of each data. If a mapping is not present (e.g. it is the first request for the data), the controller accesses the L2P mapping table 120 and stores the mapping in the cache 122. When the controller 123 executes the read command or write command, the controller accesses the mapping from the cache and reads the data from or writes the data to the NVM 110 at the specified physical address. The cache may be stored in the form of a table or other data structure which includes a logical address associated with each memory location 112 in NVM where data is being read.

The NVM 110 includes sense amplifiers 124 and data latches 126 connected to each memory location 112. For example, the memory location 112 may be a block including cells 116 on multiple bit lines, and the NVM 110 may include a sense amplifier 124 on each bit line. Moreover, one or more data latches 126 may be connected to the bit lines and/or sense amplifiers. The data latches may be, for example, shift registers. When data is read from the cells 116 of the memory location 112, the sense amplifiers 124 sense the data by amplifying the voltages on the bit lines to a logic level (e.g. readable as a '0' or a '1'), and the sensed data is stored in the data latches 126. The data is then transferred from the data latches 126 to the controller 123, after which the data is stored in the volatile memory 118 until it is transferred to the host device 104. When data is written to the cells 116 of the memory location 112, the controller 123 stores the programmed data in the data latches 126, and the data is subsequently transferred from the data latches 126 to the cells 116.

The storage device 102 includes a controller 123 which includes circuitry such as one or more processors for executing instructions and can include a microcontroller, a Digital Signal Processor (DSP), an Application-Specific Integrated Circuit (ASIC), a Field Programmable Gate Array (FPGA), hard-wired logic, analog circuitry and/or a combination thereof.

The controller 123 is configured to receive data transferred from one or more of the cells 116 of the various memory locations 112 in response to a read command. For example, the controller 123 may read the data 119 by activating the sense amplifiers 124 to sense the data from cells 116 into data latches 126, and the controller 123 may receive the data from the data latches 126. The controller 123 is also configured to program data into one or more of the cells 116 in response to a write command. For example, the controller 123 may write the data 119 by sending data to the data latches 126 to be programmed into the cells 116. The controller 123 is further configured to access the L2P mapping table 120 in the NVM 110 when reading or writing data to the cells 116. For example, the controller 123 may receive logical-to-physical address mappings from the NVM 110 in response to read or write commands from the host device 104, identify the physical addresses mapped to the logical addresses identified in the commands (e.g. translate the logical addresses into physical addresses), and access or store data in the cells 116 located at the mapped physical addresses.

The controller 123 and its components may be implemented with embedded software that performs the various functions of the controller described throughout this disclosure. Alternatively, software for implementing each of the aforementioned functions and components may be stored in the NVM 110 or in a memory external to the storage device 102 or host device 104, and may be accessed by the controller 123 for execution by the one or more processors of the controller 123. Alternatively, the functions and components of the controller may be implemented with hardware in the controller 123, or may be implemented using a combination of the aforementioned hardware and software.

In operation, the host device 104 stores data in the storage device 102 by sending a write command to the storage device 102 specifying one or more logical addresses (e.g., LBAs) as well as a length of the data to be written. The interface element 106 receives the write command, and the controller allocates a memory location 112 in the NVM 110 of storage device 102 for storing the data. The controller 123 stores the L2P mapping in the NVM (and the cache 122) to map a logical address associated with the data to the physical address of the memory location 112 allocated for the data. The controller also stores the length of the L2P mapped data. The controller 123 then stores the data in the memory location 112 by sending it to one or more data latches 126 connected to the allocated memory location, from which the data is programmed to the cells 116.

The host 104 may retrieve data from the storage device 102 by sending a read command specifying one or more logical addresses associated with the data to be retrieved from the storage device 102, as well as a length of the data to be read. The interface 106 receives the read command, and the controller 123 accesses the L2P mapping in the cache 122 or otherwise the NVM to translate the logical addresses specified in the read command to the physical addresses indicating the location of the data. The controller 123 then reads the requested data from the memory location 112 specified by the physical addresses by sensing the data using the sense amplifiers 124 and storing them in data latches 126 until the read data is returned to the host 104 via the host interface 106.

Figure 3:
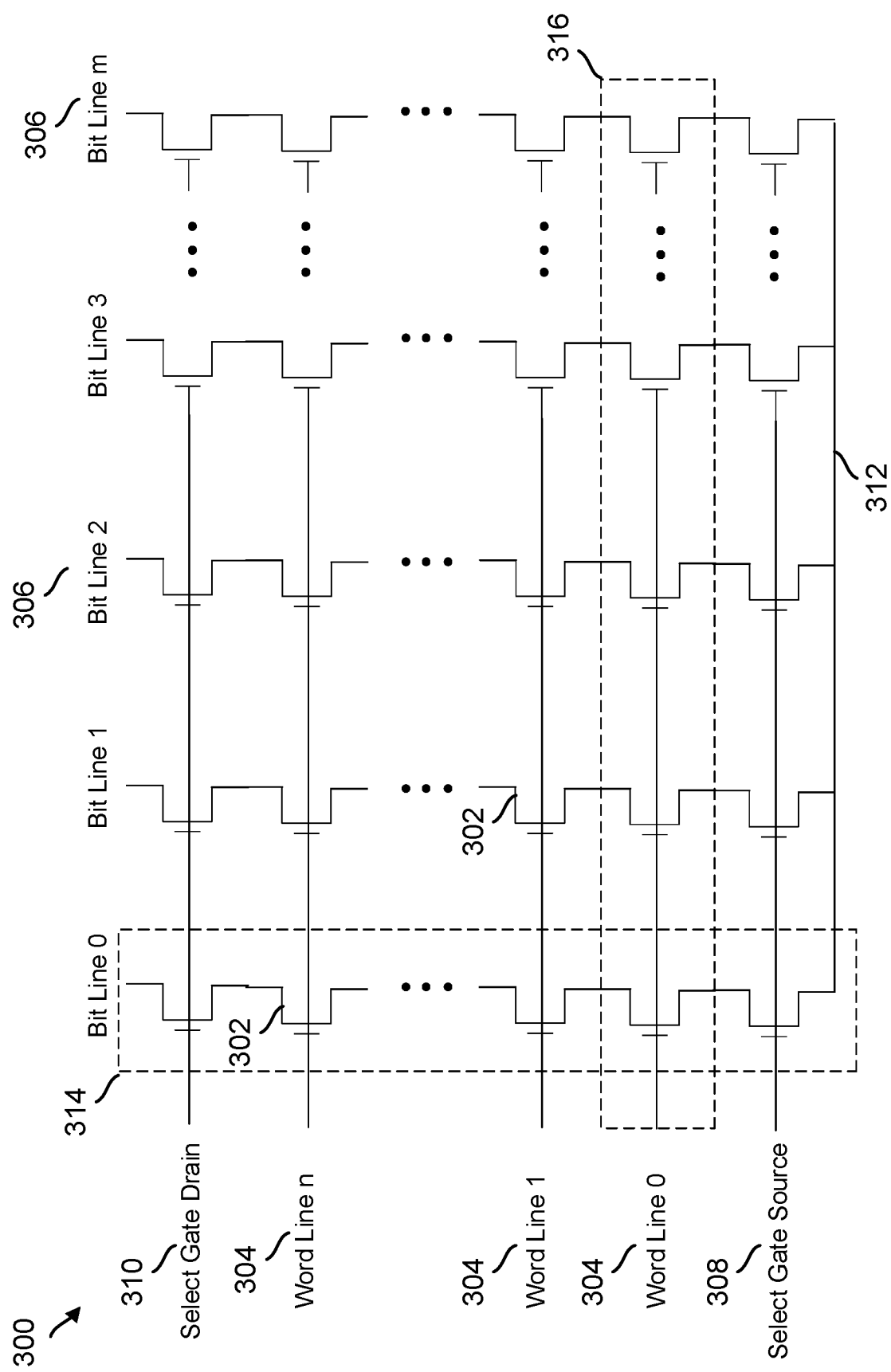
FIG. 3 is a conceptual diagram illustrating an example of an array of memory cells in the storage device of FIG. 1.

FIG. 3 illustrates an example of a NAND memory array 300 of cells 302. Cells 302 may correspond to cells 116 in the NVM 110 of FIG. 1. Multiple cells 302 are coupled to word lines 304 and bit lines 306. For example, the memory array 300 may include n word lines and m bit lines within a block 114 of the NVM 110, where n and m are predefined according to the size of the block. Each word line and bit line may be respectively associated with a row and column address, which the controller 123 may use to select particular word lines and bit lines (e.g. using a row and column decoder). For example, word lines 0-n may each be associated with their own row address (e.g. word line 0 may correspond to word line address 0, word line 1 may correspond to word line address 1, etc.), and bit lines 0-m may each be associated with their own column address (e.g. bit line 0 may correspond to bit line address 0, bit line 1 may correspond to bit line address 1, etc.). Select gate source (SGS) cells 308 and select gate drain (SGD) cells 310 are coupled to the memory cells 302 on each bit line 306. The SGS cells 308 and SGD cells 310 connect the memory cells 302 to a source line 312 (e.g. ground) and bit lines 306, respectively. A string 314 may include a group of cells 302 (including SGS and SGD cells 308, 310) coupled to one bit line within a block, while a page 316 may include a group of cells 302 coupled to one word line within the block.

Figure 4:
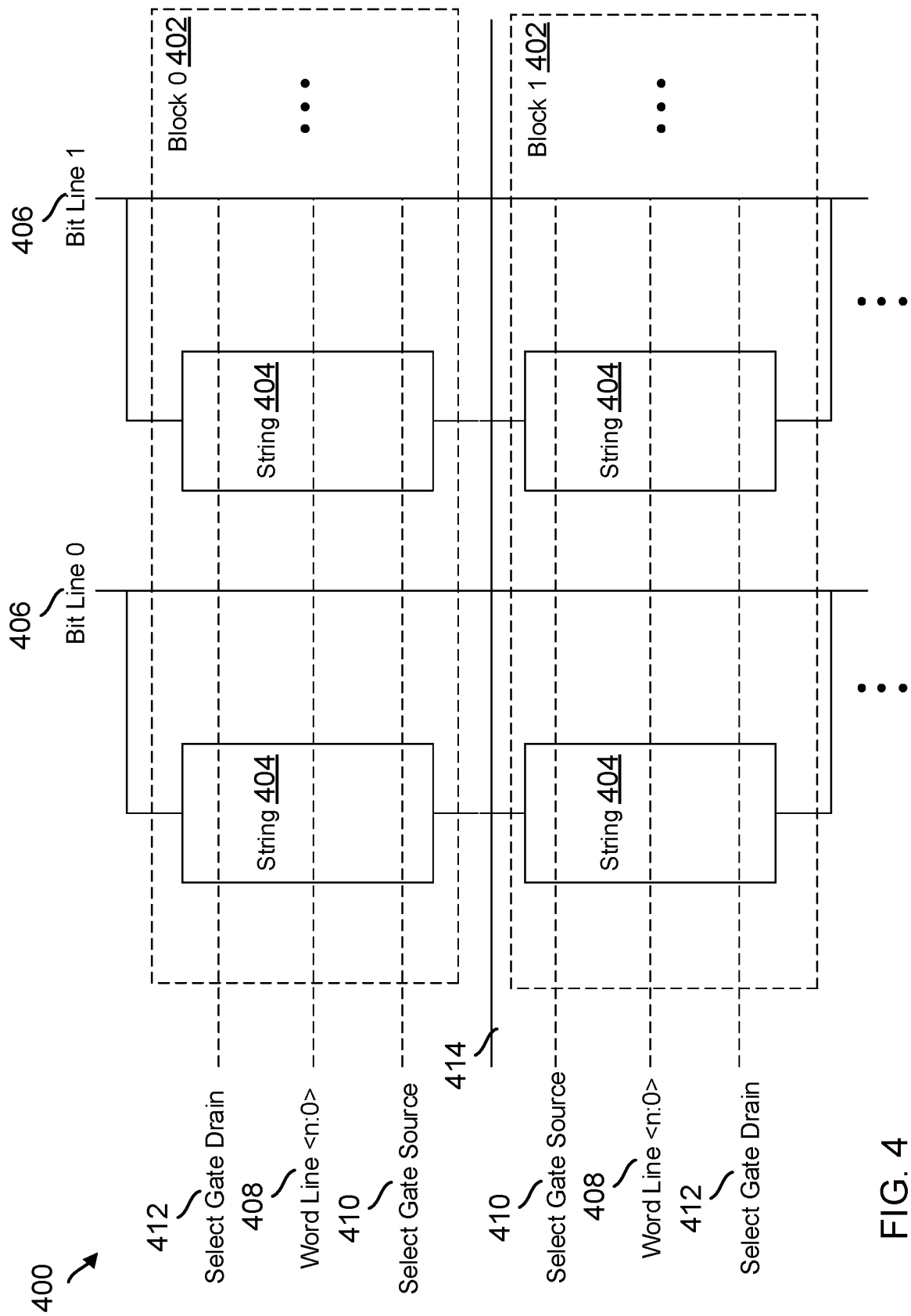
FIG. 4 is a conceptual diagram illustrating an example of an array of blocks in the storage device of FIG. 1.

FIG. 4 illustrates an example of a NAND memory array 400 of blocks 402 including multiple strings 404. Blocks 402 may correspond to blocks 114 in the NVM 110 of FIG. 1, and strings 404 may each correspond to string 314 in FIG. 3. As in the memory array 300 of FIG. 3, each string 404 may include a group of memory cells each coupled to a bit line 406 and individually coupled to respective word lines 408. Similarly, each string may include a SGS cell 410 and SGD cell 412 which respectively connects the memory cells in each string 404 to a source line 414 and bit line 406.

When the controller 123 reads data from or writes data to a page 316 of cells 302 (i.e. on a word line 304, 408), the controller may send a command to apply a read voltage or program voltage to the selected word line and a pass through voltage to the other word lines. The read or programmed state of the cell (e.g. a logic '0' or a logic '1' for SLCs) may then be determined based on a threshold voltage of the cells 302. For example, during an SLC read operation, if the threshold voltage of a cell 302 is smaller than the read voltage (i.e. current flows through the cell in response to the read voltage), the controller 123 may determine that the cell stores a logic '1', while if the threshold voltage of the cell 302 is larger than the read voltage (i.e. current does not flow through the cell in response the read voltage), the controller 123 may determine that the cell stores a logic '0'. Similarly, during an SLC program operation, the controller may store a logic '0' by sending a command to apply the program voltage to the cell 302 on the word line 304, 408 until the cell reaches the threshold voltage, and during an erase operation, the controller may send a command to apply an erase voltage to the block 402 including the cells 302 (e.g. to a substrate of the cells such as a p-well) until the cells reduce back below the threshold voltage (back to logic '1').

For cells that store multiple bits (e.g. MLCs, TLCs, etc.), each word line 304, 408 may include multiple pages 316 of cells 302, and the controller may similarly send commands to apply read or program voltages to the word lines to determine the read or programmed state of the cells based on a threshold voltage of the cells. For instance, in the case of TLCs, each word line 304, 408 may include three pages 316, including a lower page (LP), a middle page (MP), and an upper page (UP), respectively corresponding to the different bits stored in the TLC. When programming TLCs, the LP may be programmed first, followed by the MP and then the UP. For example, a program voltage may be applied to the cell on the word line 304, 408 until the cell reaches a first intermediate threshold voltage corresponding to a least significant bit (LSB) of the cell. Next, the LP may be read to determine the first intermediate threshold voltage, and then a program voltage may be applied to the cell on the word line until the cell reaches a second intermediate threshold voltage corresponding to a next bit of the cell (between the LSB and the most significant bit (MSB)). Finally, the MP may be read to determine the second intermediate threshold voltage, and then a program voltage may be applied to the cell on the word line until the cell reaches the final threshold voltage corresponding to the MSB of the cell. Similarly, when reading TLCs, the controller 123 may read the LP to determine whether the LSB stores a logic 0 or 1 depending on the threshold voltage of the cell, the MP to determine whether the next bit stores a logic 0 or 1 depending on the threshold voltage of the cell, and the UP to determine whether the final bit stores a logic 0 or 1 depending on the threshold voltage of the cell.

Figure 5:
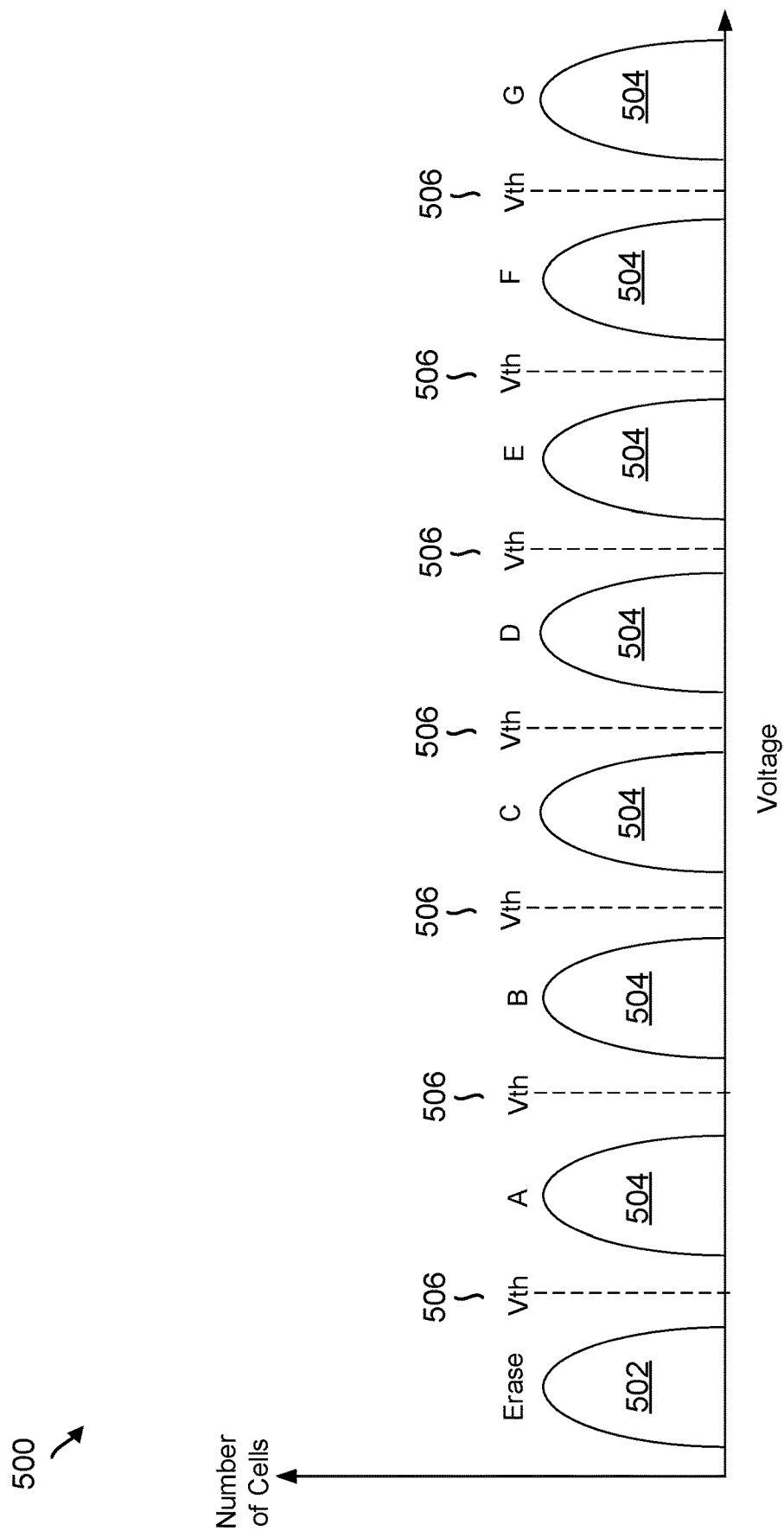
FIG. 5 is a graphical diagram illustrating an example of a voltage distribution chart for triple-level cells in the storage device of FIG. 1.

FIG. 5 illustrates an example of a voltage distribution chart 500 illustrating different NAND states for TLCs (e.g. cells 116, 302) storing three bits of data (e.g. logic 000, 001, etc. up to logic 111). The TLCs may include an erase state 502 corresponding to logic '111' and multiple program states 504 (e.g. A-G) corresponding to other logic values '000-110'. The program states 504 may be separated by different threshold voltages 506. Initially, the cells 116, 302 may be in the erase state 502, e.g. after the controller 123 erases a block 114, 402 including the cells. When the controller 123 program LPs, MPs, and UPs as described above, the voltages of the cells 116, 302 may be increased until the threshold voltages 506 corresponding to the logic values to be stored are met, at which point the cells transition to their respective program states 504. While FIG. 5 illustrates eight NAND states for TLCs, the number of states may be different depending on the amount of data that is stored in each cell 116, 302. For example, SLCs may have two states (e.g. logic 0 and logic 1), MLCs may have four states (e.g. logic 00, 01, 10, 11), and QLCs may have sixteen states.

When the controller 123 attempts to program cells 116, 302 of a selected word line 304, 408 into one of the program states 504, the controller may perform incremental step pulse programming (ISPP) over a number of programming loops or ISPP cycles. For example, a programming voltage (e.g. a high voltage) may be applied to the selected word line 304, 408, a pass through voltage (e.g. a high voltage lower than the programming voltage) may be applied to the other word lines 304, 408, a bit line program voltage (e.g. a low voltage) may be applied on the bit lines 306, 406 connected to the selected cells being programmed on the selected word line, and a bit line inhibit voltage (e.g. a high voltage) may be applied on the bit lines 306, 406 connected to the other cells not being programmed on the selected word line. Applying a high programming voltage to the selected word line and a low voltage to the selected bit lines allows electrons to tunnel from the channel into the charge trapping layer of those selected cells, thereby causing the threshold voltage of the cells to increase. On the other hand, applying a high voltage to unselected bit lines inhibits electrons from tunneling from the channel into the charge trapping layer of those unselected cells, thereby preventing the threshold voltage of those cells from increasing. Thus, bit lines coupled to cells programmed to lower states may be inhibited to prevent the threshold voltage of those cells from increasing while other cells are programmed to higher states. For instance, in the case of TLCs, the bit lines of cells that are first programmed into the A state may be inhibited first, followed by the bit lines of different cells that are programmed into the B state, followed by those that reach the C state, then the D state, and so forth until the remaining cells on the selected word line ultimately reach the G state and all cells on the selected word line have been programmed.

After the programming voltage is applied in one programming loop or ISPP cycle, a program verify voltage (e.g. a low voltage) may be applied to the word line 304, 408 to determine whether the threshold voltage of a cell has increased beyond a respective threshold voltage into an intended program state. If none of the cells have transitioned into an intended programming state, then another programming loop or ISPP cycle is performed in which a higher programming voltage may be applied to further increase the threshold voltage of the cells. Subsequently, a program verify voltage may again be applied to determine whether the threshold voltage of a cell has transitioned into an intended program state. The above process of incrementally increasing the programming voltage and verifying the voltage threshold of the selected cells may be repeated over a number of programming loops. If the cells transition into their respective programming states and the total number of programming loops does not exceed a predetermined loop count, the controller may determine that the cells have entered their intended program states and are thus successfully programmed.

Figure 6:
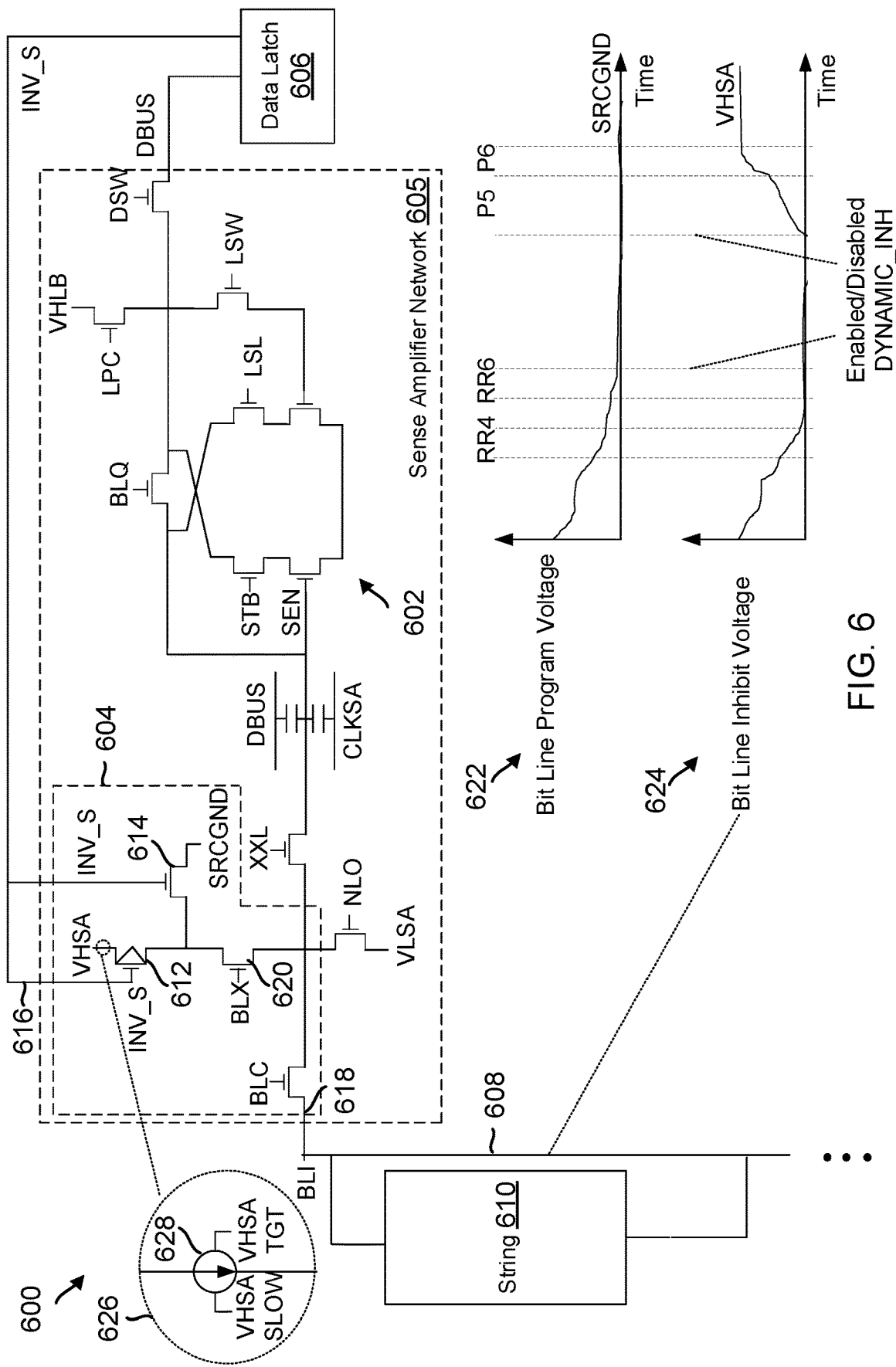
FIG. 6 is a conceptual diagram illustrating an example of a sense amplifier coupled to a bit line and data latch in the storage device of FIG. 1.

FIG. 6 illustrates an example diagram 600 of a sense amplifier 602 and pre-charge circuit 604 within a sense amplifier network 605 and coupled to a data latch 606 and a bit line 608. One or more strings 610 of cells (e.g. cells 116, 302) may be coupled to the bit line 608. The sense amplifier 602 may correspond to one of the sense amplifiers 124 of FIG. 1, the data latch 606 may correspond to one of the data latches 126 of FIG. 1, the bit line 608 may correspond to one of the bit lines 306, 406 of FIGS. 3 and 4, and the string 610 may correspond to string 314, 404 of FIGS. 3 and 4. Thus, while FIG. 6 illustrates a single bit line coupled to the sense amplifier 602, pre-charge circuit 604, and data latch 606, each bit line 306, 406 may be similarly coupled to a respective sense amplifier, pre-charge circuit and data latch.

The pre-charge circuit 604 may include a bit line inhibit transistor 612 (e.g. a p-type metal-oxide-semiconductor (PMOS) transistor) having a drain connected to a high voltage supply (e.g. VHSA), and a bit line program transistor 614 (e.g. an n-type metal-oxide-semiconductor (NMOS) transistor) having a drain connected to a low voltage supply (e.g. SRCGND). The sources of the bit line inhibit transistor 612 and the bit line program transistor 614 may be connected to each other. The gates of the bit line inhibit transistor and bit line program transistor may be connected to an output voltage 616 of the data latch 606, for example, an inverted data latch output voltage (INV_S). The bit line 608 may be coupled to the sources of the bit line inhibit transistor and bit line program transistor via transistors 618, 620. A BLC voltage may be applied to the transistor 618, and a BLX voltage may be applied to transistor 620. The BLC and BLX voltages may be activated during programming to control the transistors 618, 620 to allow for passing of VHSA or SRCGND to the bit line 608.

During a program operation, the pre-charge circuit 604 may be configured to apply a bit line program voltage to the bit line 608 as illustrated for example in chart 622, or a bit line inhibit voltage to the bit line 608 as illustrated for example in chart 624, in response to the output voltage 616 of the data latch 606. For example, when the controller 123 transfers data to the data latch 606 to be programmed into a cell on the bit line 608, the data latch 606 may store a logic '0', and the output voltage 616 (e.g. the inverted voltage INV_S) of the data latch 606 may correspond to a logic '1' (a high voltage). As a result, the bit line program transistor 614 may be activated while bit line inhibit transistor 612 may be deactivated, allowing the low voltage SRCGND to pass to the source of the bit line program transistor 614 and preventing the high voltage VHSA from passing to the source of the bit line inhibit transistor 612. Thus, when the BLC and BLX voltages are activated during a programming phase or programming loop (e.g. at times P5 and P6 illustrated in chart 622), the bit line 608 may be ramped down to SRCGND, allowing the cells coupled to the bit line 608 to be programmed in response to an applied word line voltage. After the cell is programmed, the data stored in the cells may be sensed by the sense amplifier 602 into the data latch 606 during a program verify phase, after which the bit line voltage is discharged during a channel clean phase (e.g. at times RR4 and RR6 illustrated in chart 622, 624) until the next programming loop. If the cell is successfully verified as transitioning into an intended program state, a logic '1' may be transferred into the data latch 606 and the output voltage 616 (e.g. the inverted voltage INV_S) of the data latch 606 may correspond to a logic '0' (a low voltage). As a result, the bit line inhibit transistor 612 may be activated while bit line program transistor 614 may be deactivated, allowing the high voltage VHSA to pass to the source of the bit line inhibit transistor 612 and preventing the low voltage SRCGND from passing to the source of the bit line program transistor 614. Thus, when the BLC and BLX voltages are activated during the subsequent programming phase or programming loop (e.g. at times P5 and P6 illustrated in chart 624), the bit line 608 may be ramped up to VHSA, preventing the cells coupled to the bit line 608 from being subsequently programmed in response to an applied word line voltage for the remainder of the program operation.

Additionally, the controller 123 may control the rate of bit line pre-charging by limiting the current that flows through the bit line 608, e.g. based on configured parameters VHSASLOW and VHSATGT shown in area 626. VHSASLOW may control the bit line inhibit voltage ramp rate during the programming phase (e.g. at time P5). For example, VHSASLOW may be a parameter set by the controller that is input to a current limiter 628 connected to VHSA whose value may change the current on the bit line, for instance, to 20 mA, 26 mA, 32 mA, and/or other configured values. VHSATGT may control the target voltage that the bit line inhibit voltage may ramp to as a percentage of VHSA (i.e. at the controlled ramp rate configured by VHSASLOW) also during the programming phase (e.g. at time P6). For example, VHSATGT may be a parameter set by the controller that is input to the current limiter 628 and whose value may change the voltage at which point VHSASLOW may no longer limit the current, for instance, at 75% VHSA, 80% VHSA, 90% VHSA, and/or other configured values.

Figure 7:
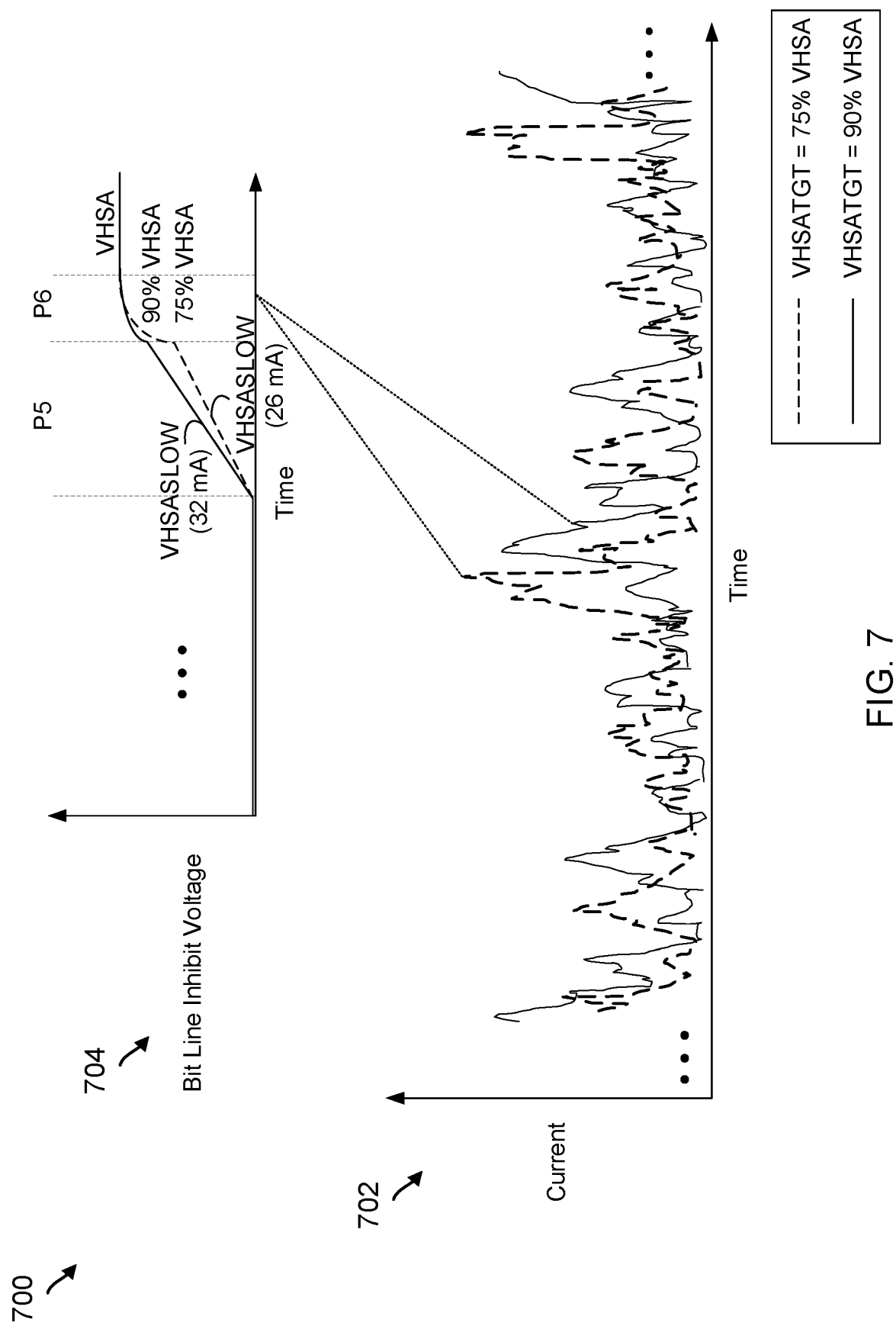
FIG. 7 are graphical diagrams illustrating an example of different currents over time due to pre-charging of bit line inhibit voltages to different target voltages at different ramp rates.

FIG. 7 illustrates an example 700 of a chart 702 showing different currents over time due to pre-charging of bit line inhibit voltages to different target voltages as illustrated in chart 704 (e.g. based on VHSATGT), and at different ramp rates (e.g. based on VHSASLOW). When the bit line inhibit voltage ramps up at time P5 as described above, the voltage may ramp faster or slower depending on the VHSASLOW parameter. For example, if the VHSASLOW parameter limits the bit line current to 32 mA, the voltage on the bit line may ramp faster than if the VHSASLOW parameter limits the bit line current to 26 mA. Faster ramp rates may result in larger peak Icc. Similarly, when the bit line inhibit voltage ramps up at time P6, the voltage may also ramp faster or slower depending on the VHSATGT parameter. For example, if the VHSATGT parameter limits VHSASLOW's effectiveness to 75% VHSA, the voltage on the bit line may ramp faster to VHSA (due to more margin or distance to cover to ramp up to VHSA) than if the VHSATGT parameter limits VHSASLOW's effectiveness to 90% VHSA (due to less margin or distance to cover to ramp up to VHSA). Smaller target voltages may result in larger peak Icc. For instance, as illustrated in chart 702, the peak current may be higher during time P6 when VHSATGT is 75% VHSA than when VHSATGT is 90% VHSA.

Additionally, referring back to FIG. 6, the controller 123 may control the timing of bit line pre-charging by shifting the period of time in which the bit line 608 pre-charges. For instance, the timing may be shifted from the current programming phase (e.g. at time P5) to the previous channel clean phase (e.g. at time RR6) based on configured parameter DYNAMIC_INH illustrated beneath chart 624. For example, DYNAMIC_INH may be a parameter set by the controller that when enabled, results in earlier ramping of BLC and/or BLX (and thus pre-charging of the bit line to VHSA) during time RR6, but when disabled, results in later ramping of BLC and/or BLX during time P5. For instance, BLC and BLX may be generated by one or more charge pumps (not shown) controlled by switches activated in response to a clock signal at time RR6 or P5 depending on whether DYNAMIC_INH is a logic 0 or a logic 1. Earlier pre-charging of the bit line 608 during RR6 may speed up the ramping of the bit line inhibit voltage prior to programming the selected cells, thereby improving the total programming time.

Figure 8:
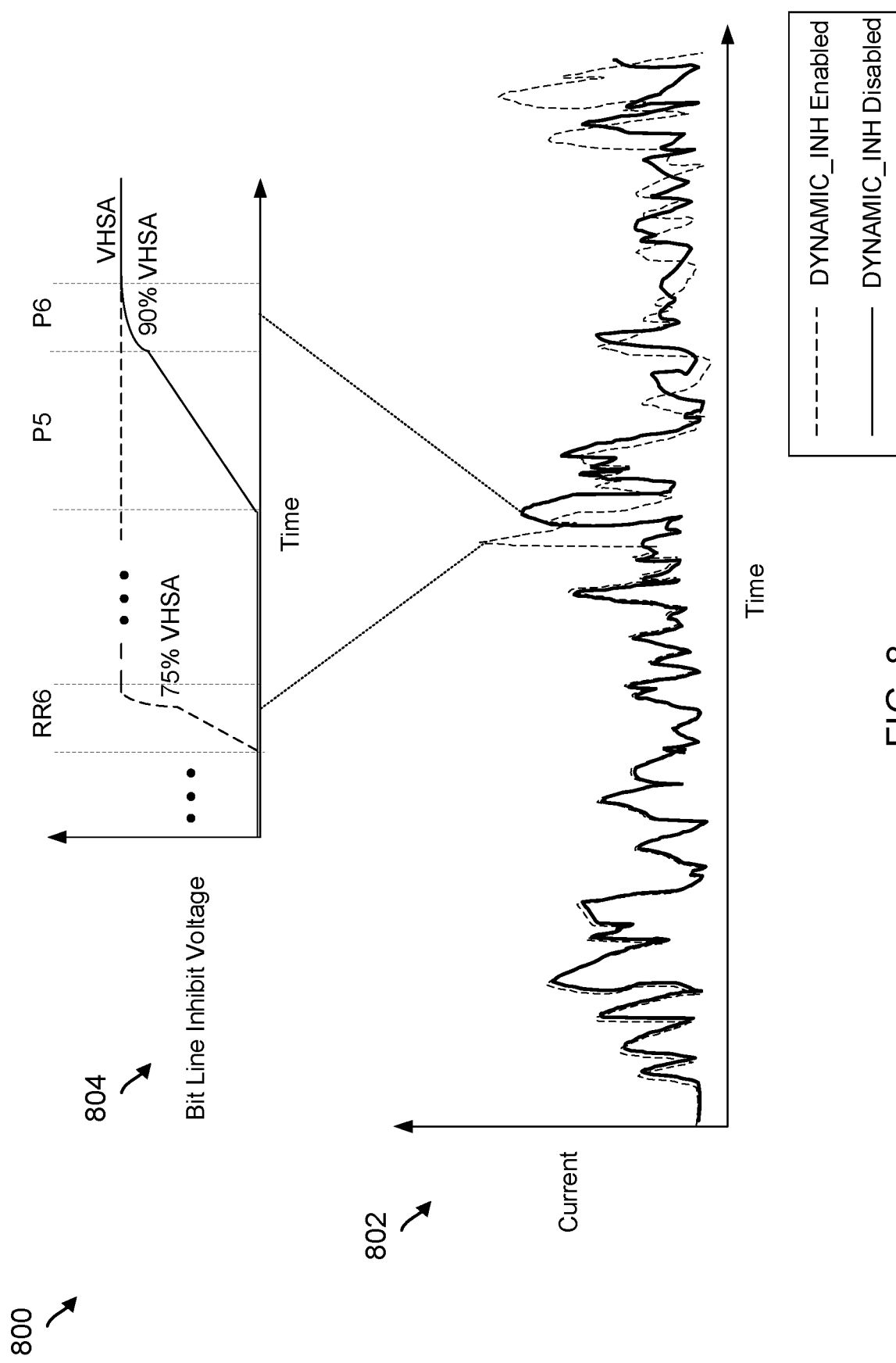
FIG. 8 are graphical diagrams illustrating an example of different currents over time due to pre-charging of bit line inhibit voltages to different target voltages at different time periods.

FIG. 8 illustrates an example 800 of a chart 802 showing different currents over time due to pre-charging of bit line inhibit voltages at different time periods as illustrated in chart 804 (e.g. based on DYNAMIC_INH), and to different target voltages (e.g. again based on VHSATGT). The DYNAMIC_INH parameter may control whether the bit line voltage ramps up during the programming phase (e.g. at times P5 and P6) or during the previous channel clean phase (e.g. at time RR6) as described above. For example, if DYNAMIC_INH is set to enabled, the voltage on the bit line may ramp during time RR6, while if DYNAMIC_INH is set to disabled, the voltage on the bit line may ramp during times P5 and P6. In some cases, ramping the voltage during time RR6 may result in larger peak Icc than ramping the voltage during times P5 and/or P6, as illustrated for instance in chart 802, when overlap of bit line pre-charging with data latch transfers exists during RR6. An example of this overlap is described below with respect to FIGS. 9A-9C.

FIGS. 9A-9C illustrate an example of bit lines (e.g. bit lines 306, 406, 608) at different times 900, 920, 940, during which some of the bit lines are coupled to data latches still awaiting transfer of write data (unfinished bit lines 902, 922, 942), other bit lines have finished data latch transfer (finished bit lines 924, 944), and other bit lines have been pre-charged (pre-charged bit lines 946). During time RR4, data may be in the process of being transferred into the data latches (e.g. data latch 606) coupled to each of the bit lines 902 in advance of the next programming phase. However, if the transfer process is not complete for all of the bit lines before time RR6, some of the bit lines 922 may still be awaiting data latch transfer while the other bit lines 924 may have finished data latch transfer. In such case, then during time RR6 when DYNAMIC_INH is enabled, the bit lines 946 which have finished data latch transfer before RR6 are pre-charged (e.g. by activating BLC and BLX for those bit lines). In the meanwhile, the other bit lines 942 continue processing data latch transfers and are respectively pre-charged when each transfer completes (e.g. by activating BLC and BLX for each bit line) until all the finished bit lines 944 are ramped to VHSA. Such overlap of bit line pre-charging and data latch transfers in multiple bit lines may thus result in high peak current during time RR6 when DYNAMIC_INH is enabled.

Figure 10B:
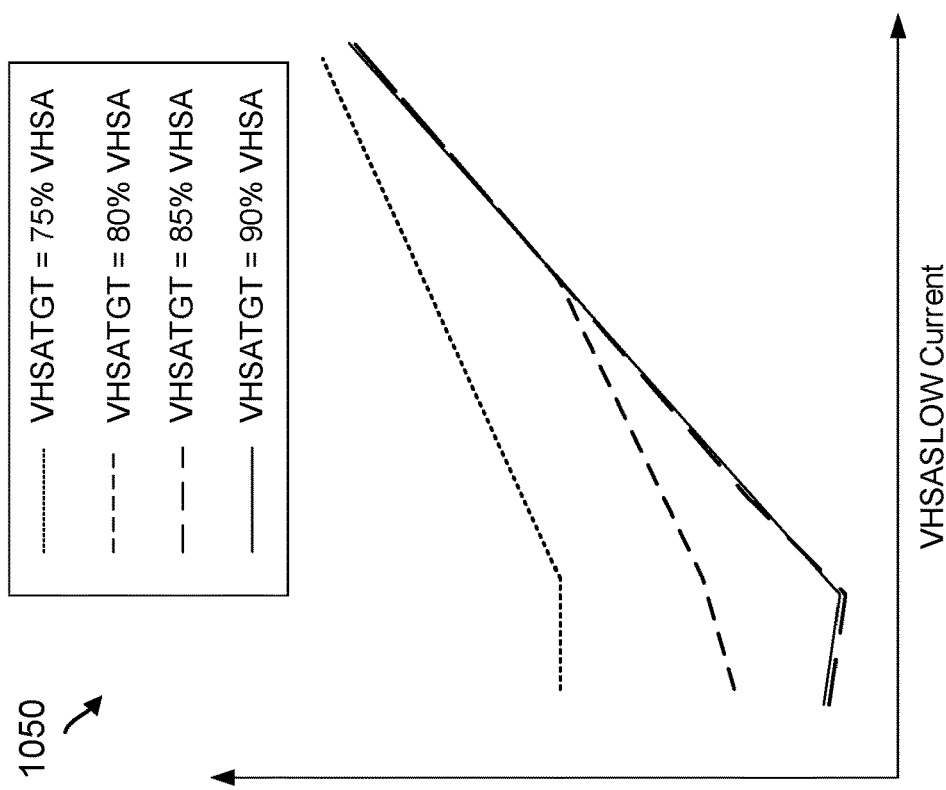
FIGS. 10A and 10B are graphical diagrams illustrating an example of a relationship between program time and peak current at different ramp rates and target voltages.
Figure 10A:
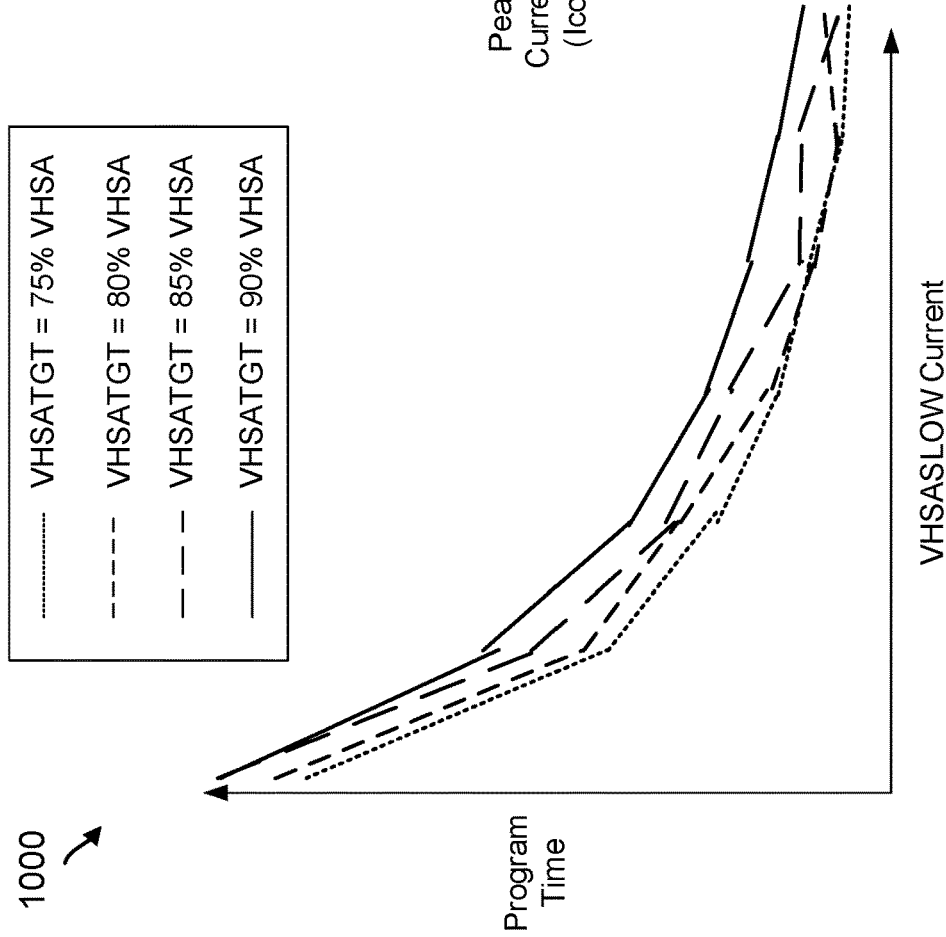

FIGS. 10A and 10B illustrate examples 1000, 1050 of a relationship between program time and peak current at different ramp rates and target voltages. As illustrated in example 1000 of FIG. 10A, increasing the ramp rate by configuring VHSASLOW to allow more bit line current to flow (i.e. limit less current) may speed up the bit line inhibit voltage ramping and thus reduce the total programming time. Similarly, reducing the target voltage by configuring VHSATGT to be a smaller percentage of VHSA may increase the margin between the target voltage and VHSA for ramping and thus further reduce the total programming time. However, as illustrated in example 1050 of FIG. 10B, reducing the total programming time in such manner may increase the peak current. For example, the peak current may be increased for VHSASLOW configurations that allow more bit line current to flow (e.g. faster ramp rates) and for VHSATGT configurations that allow more margin for ramping (e.g. smaller target voltages). Thus, a trade-off may exist between program performance and peak current. Moreover, peak current may be highly correlated to average current (i.e. the higher the peak Icc, the higher the average Icc), which may impact power efficiency during programming. Such currents may even be higher during the middle of a program operation than the beginning and end of the program operation, as illustrated for example below with respect to FIG. 11.

Figure 11:
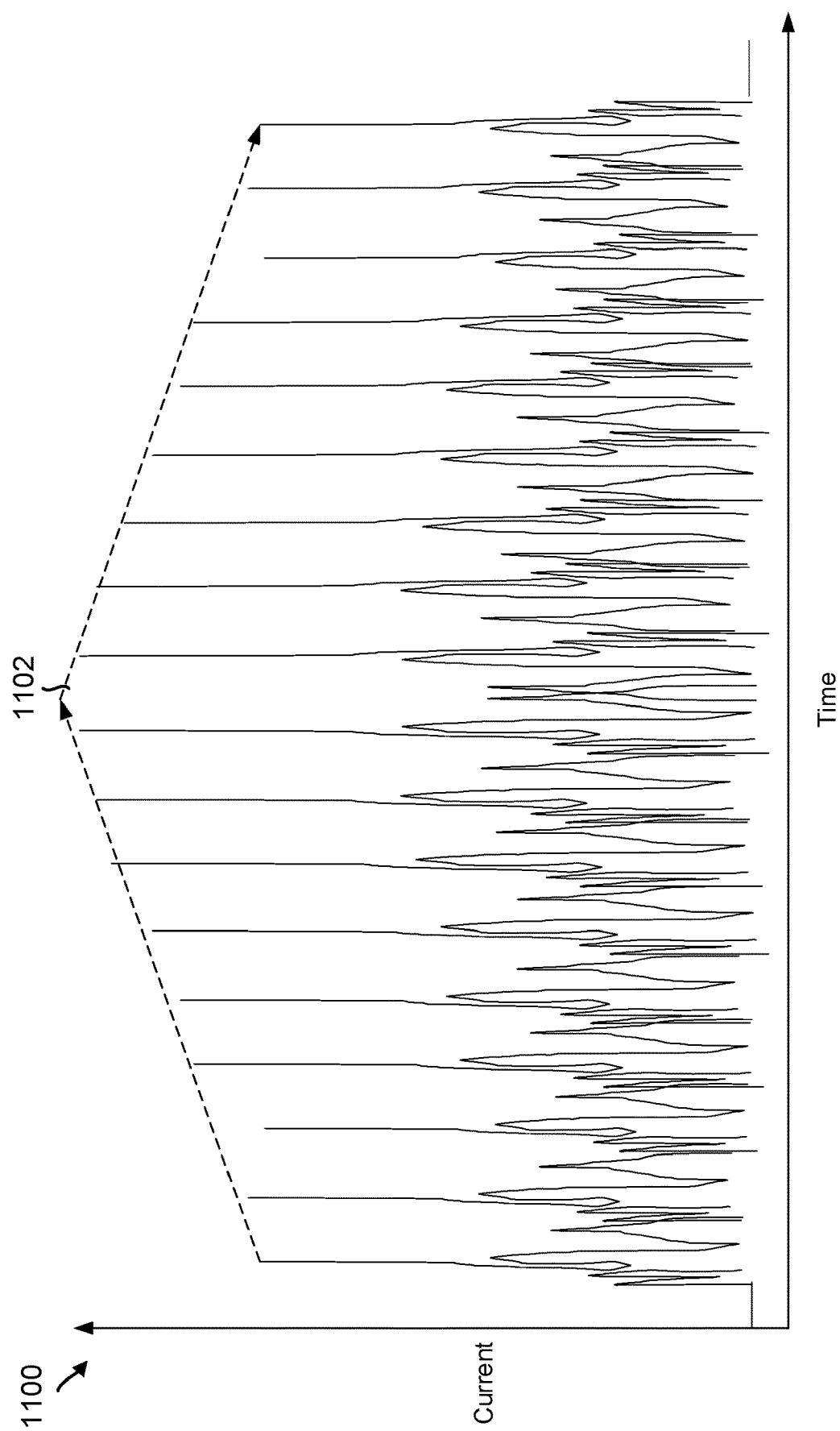
FIG. 11 is a graphical diagram illustrating an example of a variation in current over time during a program operation.
Figure 12:
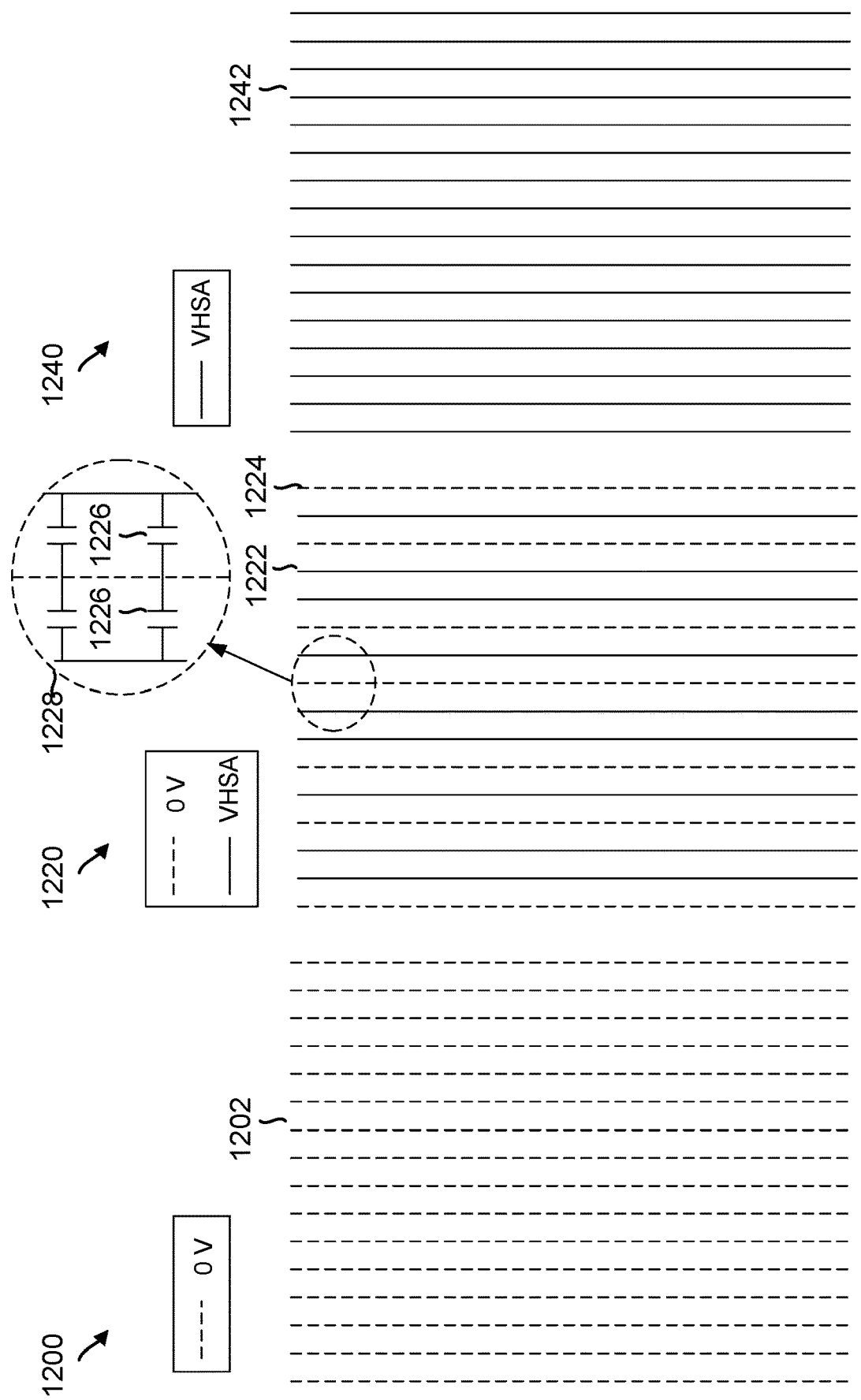
FIGS. 12A-12C are conceptual diagrams illustrating an example arrangement of pre-charged bit lines at different times of a program operation.

FIG. 11 illustrates an example 1100 of a variation in current over time during a program operation. As shown, the peak current 1102 may increase from the beginning towards the middle of the program operation and may decrease from the middle towards the end of the program operation. For instance, the peak current may be highest (e.g. increased by 30% with respect to the beginning of the operation) after half of a total number of programming loops in the operation have occurred. An example describing this phenomenon is shown below with respect to FIGS. 12A-12C.

FIGS. 12A-12C illustrate examples 1200, 1220, 1240 of bit lines (e.g. bit lines 306, 406, 608) at different times of a program operation. FIG. 12A represents the example 1200 at the beginning of the program operation when the bit lines coupled to a page of cells are all stressed to 0 V or SRCGND for programming (program enabled bit lines 1202). FIG. 12B represents the example 1220 at the middle of the program operation when many of the bit lines have been successfully transitioned into their intended program state (e.g. A, B, C, and possibly D) and thus have been pre-charged to VHSA to inhibit further programming (inhibit bit lines 1222), while the remaining bit lines have not yet reached their program state are thus still stressed to 0 V for programming (program enabled bit lines 1224). FIG. 12C represents the example 1240 at the end of the program operation when all of the bit lines have been successfully programmed (e.g. up to the G state for TLCs) and thus have been pre-charged to VHSA to inhibit further programming (inhibit bit lines 1242).

During a program operation, states with lower threshold voltages (e.g. A) may be programmed before states with higher threshold voltages (e.g. G). Moreover, cells having lower program states may be arranged adjacently on a word line with cells having higher program states. For instance, the cells on the word line may be programmed such that a first cell is in the A state, a second cell is in the G state, a third cell is in the B state, a fourth cell is in the F state, etc. Thus, during the middle of the program operation, there may be a higher probability of alternating, program enabled bit lines 1224 and inhibit bit lines 1222 such as illustrated in example 1220 than during the beginning and end of the program operation such as illustrated in examples 1200, 1240. Such arrangements may result in a capacitance 1226 between program enabled bit lines and inhibit bit lines during the middle of the program operation, as shown in area 1228, which may further increase the peak current in comparison to the beginning and end of the program operation. Accordingly, to reduce the higher peak and average current in the middle of the program operation, the storage device described in the present disclosure allows the controller to pre-charge the inhibit bit lines 1222, 1242 at different ramp rates (e.g. based on VHSASLOW) or different time periods (e.g. based on DYNAMIC_INH) to different target voltages (e.g. based on VHSATGT) during the middle of the operation than during the beginning and end of the operation, based on an inhibit bit line count from the data latches coupled to the bit lines.

Figure 13:
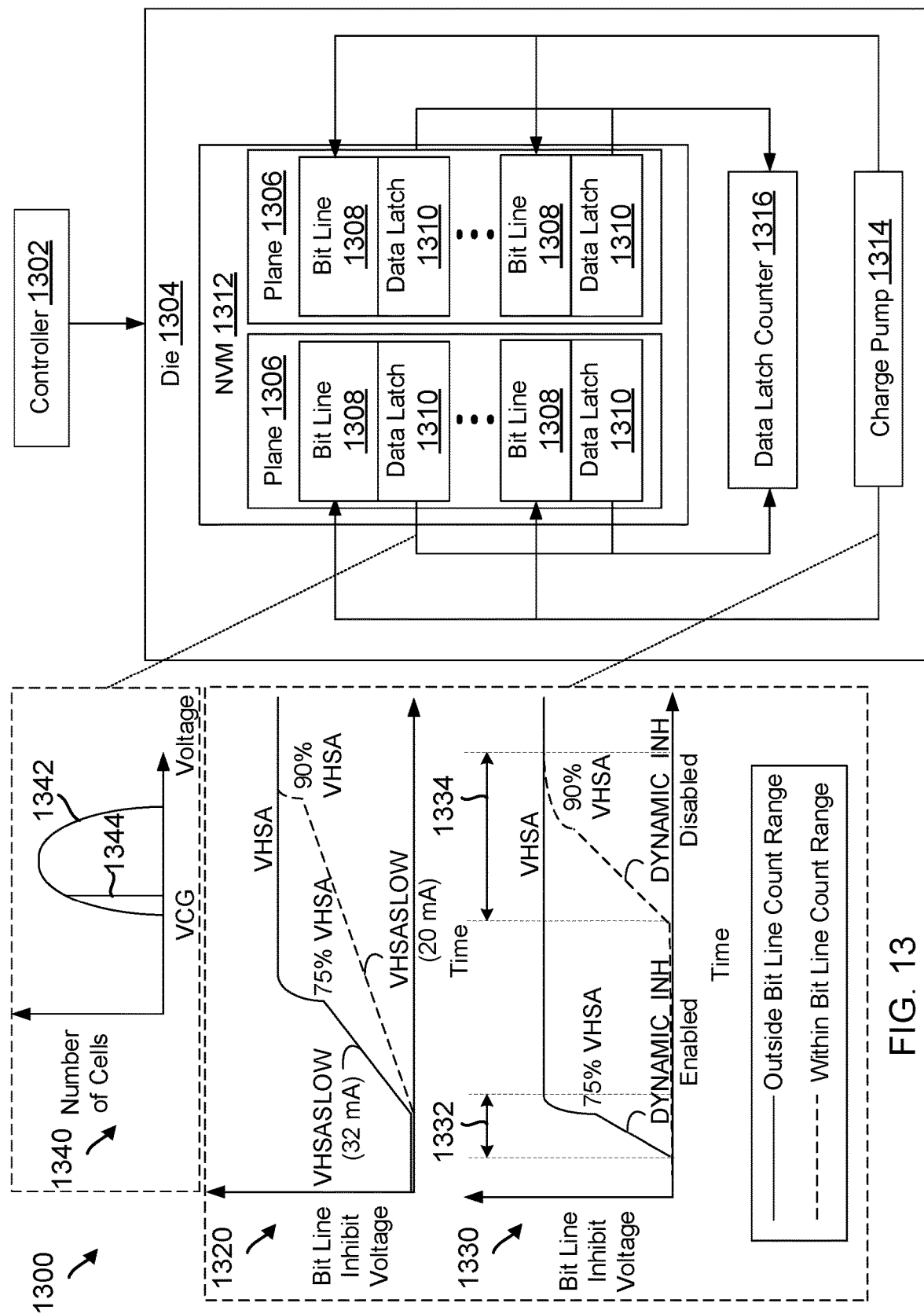
FIG. 13 is a conceptual diagram illustrating an example of a controller that send data to a die to be programmed following different examples of bit line pre-charging based on data latch counts in the storage device of FIG. 1.

FIG. 13 illustrates an example 1300 of a controller 1302 in communication with a die 1304. The die 1304 may include planes 1306 of blocks including cells coupled to bit lines 1308, with each bit line 1308 coupled to a sense amplifier network (not shown) and a data latch 1310. The controller 1302 may correspond to controller 123 of FIG. 1, and the die 1304 may include a NVM 1312 corresponding to the NVM 110 of FIG. 1. The NVM 1312 may include the planes 1306 with bit lines 1308 and data latches 1310, the latter of which may respectively correspond to the bit lines 306, 406, 608, 1222, 1242 and data latches 126, 606 of FIGS. 3, 4, 6, and 12. While FIG. 13 illustrates an example where the controller 1302 is external to the die 1304, the controller may alternatively be internal to the die 1304.

The die 1304 may include a charge pump 1314 that ramps the bit line inhibit voltage applied to the bit lines 1308 in response to a program command from the controller 1302. For example, when the controller 1302 sends a write command to the die that indicates a selected word line and selected bit lines coupled to the cells to be programmed, a programming loop or phase may occur in which the un-selected bit lines coupled to previously programmed cells are pre-charged using the charge pump 1314 to inhibit programming of those cells. For instance, referring to FIG. 6, the charge pump 1314 may charge a BLC and BLX voltage that is applied to transistors 618, 620 of the pre-charge circuit 604 in the sense amplifier network 605, which may cause the voltage of the bit line 608, 1308 to be ramped up to VHSA subsequent to activation of the bit line inhibit transistor 612 in response to the output 616 from the data latch 606, 1310.

The controller 1302 (or other circuitry in the die 1304) may control the ramping rate, target voltage and time period of bit line pre-charging using configured VHSASLOW, VHSATGT, and DYNAMIC_INH parameters, respectively. For example, the controller may set VHSASLOW and VHSATGT to certain values that are input into current limiter 628 to reduce the current on bit line 608, 1308 and slow the voltage ramping rate until a corresponding percentage of VHSA. In another example, the controller may set DYNAMIC_INH to a value (e.g. disabled or enabled) that is input into the charge pump 1314 to activate or switch on the charging when a clock input indicates a time P5 or RR6, respectively. These values may be stored as configurable parameters in the NVM 1312 or a volatile memory of the controller or die. For example, the NVM 1312 may include a register that stores a bitmap indicating pre-configured VHSASLOW values, another register that stores a bitmap indicating pre-configured VHSATGT values, and an additional register that stores a bitmap indicating the DYNAMIC_INH values. Alternatively, the parameters may all be stored in the same register. The VHSASLOW values may be, for example, 8, 14, 20, 26, 32, 38, 44, 50, and/or other amounts of current (mA), the VHSATGT values may be, for example, 75%, 80%, 85%, 90%, and/or other percentages of VHSA, and the DYNAMIC_INH values may be, for example, enabled and disabled. The controller may select the corresponding parameters by setting the register(s) to particular bit combinations to indicate the selected VHSASLOW, VHSATGT, and DYNAMIC_INH, as illustrated for example in Tables 1-3 respectively below. Alternatively, for DYNAMIC_INH, the controller may simply toggle an input (e.g. to the charge pump) to indicate enabled or disabled without storing the parameter in a register.

TABLE 1

| [7] | [6] | [5] | [4] | [3] | [2] | [1] | [0] | VHSASLOW |
|---|---|---|---|---|---|---|---|---|
| 0 | 0 | 0 | | | | | | 8 |
| 0 | 0 | 1 | | | | | | 14 |
| 0 | 1 | 0 | | | | | | 20 |
| 0 | 1 | 1 | | | | | | 26 |
| 1 | 0 | 0 | | | | | | 32 |
| 1 | 0 | 1 | | | | | | 38 |
| 1 | 1 | 0 | | | | | | 44 |
| 1 | 1 | 1 | | | | | | 50 |

TABLE 2

| [7] | [6] | [5] | [4] | [3] | [2] | [1] | [0] | VHSATGT |
|---|---|---|---|---|---|---|---|---|
| | | | | 0 | 0 | | | 75% |
| | | | | 0 | 1 | | | 80% |
| | | | | 1 | 0 | | | 85% |
| | | | | 1 | 1 | | | 90% |

TABLE 3

| [7] | [6] | [5] | [4] | [3] | [2] | [1] | [0] | DYNAMIC_INH |
|---|---|---|---|---|---|---|---|---|
| | | | | | | | 0 | disable |
| | | | | | | | 1 | enable |

Moreover, the die 1304 may include a data latch counter 1316 that receives the output 616 from each of the data latches 606, 1310 coupled to each of the bit lines 608, 1308. For example, the data latch counter 1316 may be hard wired to the output 616 from each data latch. While FIG. 13 illustrates an example where the data latch counter is internal to the die, the data latch counter 1316 may alternatively be external to the die (e.g. in the controller 1302). The data latch counter 1316 may also be arranged chip next to array (CNA) or, to save space, chip under array (CUA)/CMOS below array (CBA), with respect the planes 1306 of the die 1304. During a programming loop or phase, the data latch counter 1316 may acquire a total number of the outputs 616 from the data latches that result in an inhibit bit line. For instance, the data latch counter 1316 may count a number of INV_S signals that activate the bit line inhibit transistor 612 of each bit line 608, 1308 for pre-charging (e.g. a low voltage INV_S or logic '0'). The value of the counter may be used to determine whether the programming loop is in the middle of the program operation or in the beginning or end of the operation, as described in more detail below.

Furthermore, the controller 1302 (or other circuitry in the die 1304) may configure lower and upper bounds of a bit line count range and store these boundaries in the NVM 1312 or in a volatile memory of the controller or die. For example, the NVM 1312 may include a register that stores a bitmap corresponding to the configured lower bounds and configured upper bounds. The lower bound may be, for example, 2,000, 3,000, 3,500, 4,000, or another amount of bit lines depending on the number of planes 1306. The upper bound may be, for example, 10,000, 11,000, 12,000, 13,000, or another amount of bit lines depending on the number of planes 1306. For instance, the lower and/or upper bound values may be larger for greater numbers of planes. The controller may select the bit line count range by setting the register to a particular bit combination to indicate the selected lower and upper bounds, as illustrated for example in Tables 4 and 5 respectively below (single plane).

TABLE 4

| [7] | [6] | [5] | [4] | [3] | [2] | [1] | [0] | Lower Bound |
|---|---|---|---|---|---|---|---|---|
| 0 | 0 | | | | | | | 2000 |
| 0 | 1 | | | | | | | 3000 |
| 1 | 0 | | | | | | | 3500 |
| 1 | 1 | | | | | | | 4000 |

TABLE 5

| [7] | [6] | [5] | [4] | [3] | [2] | [1] | [0] | Upper Bound |
|---|---|---|---|---|---|---|---|---|
| 0 | 0 | | | | | | | 10000 |
| 0 | 1 | | | | | | | 11000 |
| 1 | 0 | | | | | | | 12000 |
| 1 | 1 | | | | | | | 13000 |

In operation, after the die 1304 receives a program operation command from the controller 1302, write data may be transferred to the data latches 1310 in advance of a programming phase. During the programming phase, the data latch counter 1316 may acquire the inhibit bit line count from the data latch outputs (e.g. the number of low voltage INV_S's or logic 0's output from the data latches 606 for example). The controller (or other circuitry in the die) may then compare the inhibit bit line count with the configured bit line count range.

In one example, if the inhibit bit line count is outside the bit line count range (e.g. the value in the data latch counter is less than the lower bound or more than the upper bound), then the bit line may be pre-charged using a default VHSASLOW and VHSATGT configuration such as illustrated by the solid lines in chart 1320. This situation may represent the beginning or end of the program operation (i.e. an earlier or later programming phase). On the other hand, if the inhibit bit line count is within the bit line count range (e.g. the value in the data latch counter is more than the lower bound or less than the upper bound), then the bit line may be pre-charged using a different, stored VHSASLOW and VHSATGT configuration such as illustrated by the dashed lines in chart 1320. This situation may represent the middle of the program operation (i.e. a middle programming phase). For instance, as illustrated in chart 1320, when the count is outside the range, VHSASLOW and VHSATGT may be respectively pre-configured to 32 mA and 75% VHSA, resulting in a faster ramp rate and maximum margin to VHSA, while when the count is within the range, VHSASLOW and VHSATGT may be respectively configured to 20 mA and 90% VHSA, resulting in a slower ramp rate and minimum margin to VHSA.

In another example, if the inhibit bit line count is outside the bit line count range, the bit line may be pre-charged using a default VHSATGT and enabled DYNAMIC_INH configuration such as illustrated by the solid lines in chart 1330. On the other hand, if the inhibit bit line count is within the bit line count range, then the bit line may be pre-charged using a different, stored VHSATGT configuration and disabled DYNAMIC_INH configuration such as illustrated by the dashed lines in chart 1330. For instance, as illustrated in chart 1330, when the count is outside the range, DYNAMIC_INH and VHSATGT may be respectively pre-configured to enabled and 75% VHSA, resulting in ramping during an earlier time period 1332 (e.g. RR6) and maximum margin to VHSA, while when the count is within the range, DYNAMIC_INH and VHSATGT may be respectively configured to disabled and 90% VHSA, resulting in ramping during a later time period 1334 (e.g. P5) and minimum margin to VHSA.

Subsequently, the cells may be read into the sense amplifiers 124, 602 during a program verify phase to determine whether programming is successful, and then the bit line voltage may be discharged and new write data transferred into the data latches 606, 1310 afterwards during a channel clean phase. If the program operation is not yet complete, then the process described above repeats for the next programming phase until the cells are all fully programmed. Accordingly, smaller peak current may be achieved during the middle of the program operation, while faster performance may be achieved during the beginning or end of the program operation. The lower and upper bounds may also be adjusted to balance the trade-off between programming performance and peak current described for example above with respect to FIGS. 10A and 10B.

Thus, peak and average Icc may be reduced during the middle of a program operation based on data latch counts. Moreover, these data latch counts may also be used to perform Bit Scan Pass Fail (BSPF). For example, referring to chart 1340, in BSPF, the controller 1302 may scan or read and verify the number of cells that have successfully transitioned into a particular state 1342 (e.g. program state 504 in FIG. 5) following programming. If the number of cells meets a threshold 1344, the bit scan passed. Otherwise, if the number of cells fails to meet the threshold 1344, the bit scan failed. The controller may determine whether the number of cells meets the threshold using the data latch counter 1316, e.g., by counting the number of outputs 616 from the data latches 606, 1310 indicating an inhibit bit line and checking that number against the threshold. Thus, the data latch counter 1316 may allow for determination of cells in different states as well as allow the reduction of peak and average current during programming.

Figure 14:
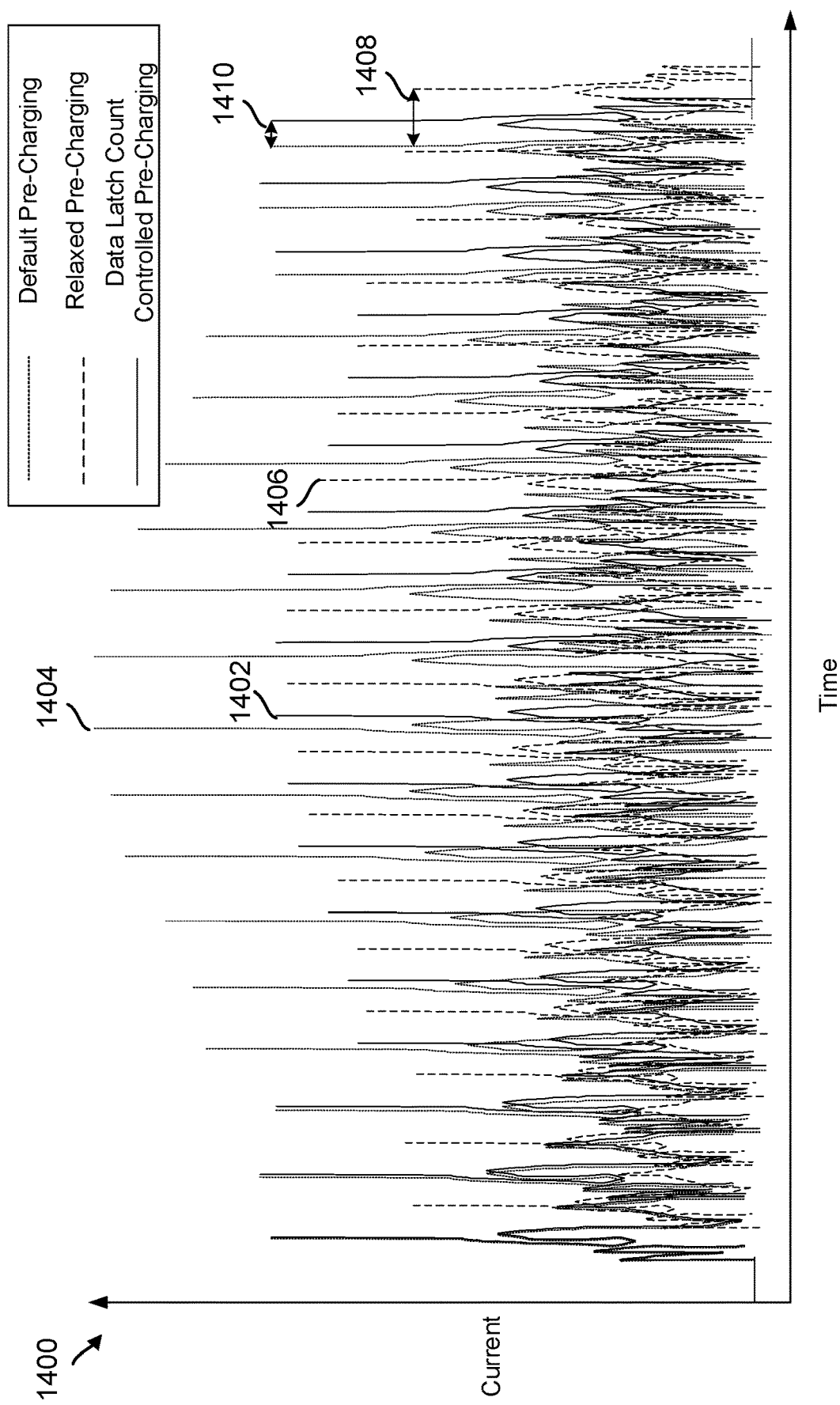
FIG. 14 is a graphical diagram illustrating an example difference in current variation over time with and without data latch counting due to bit line pre-charging at different ramp rates and target voltages during a program operation.

FIG. 14 illustrates an example 1400 showing a difference in current variation over time, with and without data latch counting as described above, due to bit line pre-charging at different ramp rates and target voltages during a program operation. As shown, the peak current 1402 in response to the data latch controlled pre-charging may be smaller throughout the program operation than the default peak current 1404 without data latch controlled pre-charging. For instance, the peak current 1402 may be reduced by 15% with respect to the default peak current 1404 when VHSATGT is configured at 80% VHSA and VHSASLOW is configured at 20 mA. Such reduction in peak Icc (and similarly average Icc) may balance power consumption in the storage device.

Reducing the peak current with data latch count control may increase the total programming time. However, simply configuring a relaxed VHSASLOW and VHSATGT with respect to the default configurations, without data latch count control, may result in an even longer programming time. For instance, FIG. 14 illustrates an example where relaxed pre-charging without data latch count control may similarly result in a peak current 1406 less than default peak current 1404 throughout the program operation, but may also result in a longer additional programming time 1408 with respect to the default VHSASLOW and VHSATGT configuration than the shorter additional programming time 1410 incurred when data latch count control is used.

Thus, data latch count control may allow programming time to be recaptured that would otherwise be lost with un-controlled relaxed pre-charging. For instance, relaxed pre-charging without data latch count control may increase the default programming time by 27 μs, while the use of data latch control may increase the default programming time by 22 μs (recapturing 5 us back). Assuming a total program time of 1000 us with expected performance of 98 MB/s, pre-charging with data latch count control may thus recover 0.494 MB/s worth of programming, which may significantly improve write performance compared to un-controlled relaxed pre-charging. Other example programming recoveries that may be similarly achieved when 5 us is recaptured for different total programming times and target performances are shown in Table 6 below:

TABLE 6

| tProg (μs) | Performance (MB/s) | Recovered Performance (MB/s) |
| --- | --- | --- |
| 500 | 197 | 1.986 |
| 600 | 164 | 1.377 |
| 700 | 140 | 1.01 |
| 800 | 123 | 0.773 |
| 900 | 109 | 0.61 |
| 1000 | 98 | 0.494 |
| 1100 | 89 | 0.408 |
| 1200 | 82 | 0.343 |
| 1300 | 76 | 0.292 |
| 1400 | 70 | 0.252 |
| 1500 | 66 | 0.219 |
| 1600 | 61 | 0.193 |
| 1700 | 58 | 0.170 |

Figure 15:
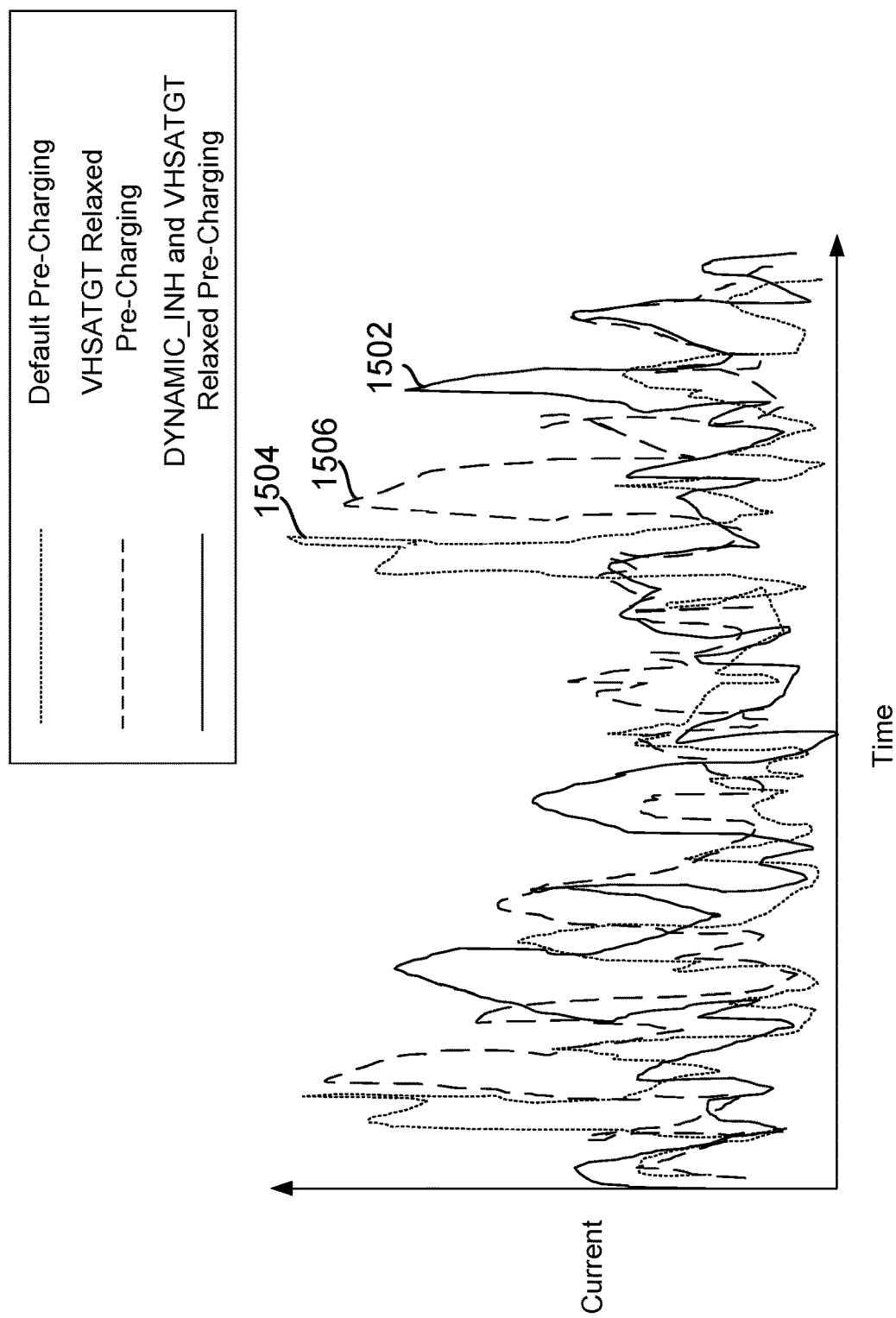
FIG. 15 is a graphical diagram illustrating an example difference in current variation over time due to bit line pre-charging at different time periods and target voltages during a program operation.

FIG. 15 illustrates an example 1500 showing a difference in current variation over time due to bit line pre-charging at different time periods and target voltages during a program operation. As shown, the peak current 1502 in response to the data latch controlled pre-charging may be smaller throughout the program operation than the default peak current 1504 without data latch controlled pre-charging. For instance, the peak current 1502 may be reduced with respect to the default peak current 1504 when VHSATGT is configured at 90% VHSA and DYNAMIC_INH is set to enabled. Moreover, the peak current 1502 with DYNAMIC_INH control may be reduced further than the peak current 1506 resulting from a relaxed VHSATGT alone. Accordingly, further power consumption balance may be achieved in the storage device through reduced peak Icc (and similarly average Icc) using data latch count control.

Figure 16:
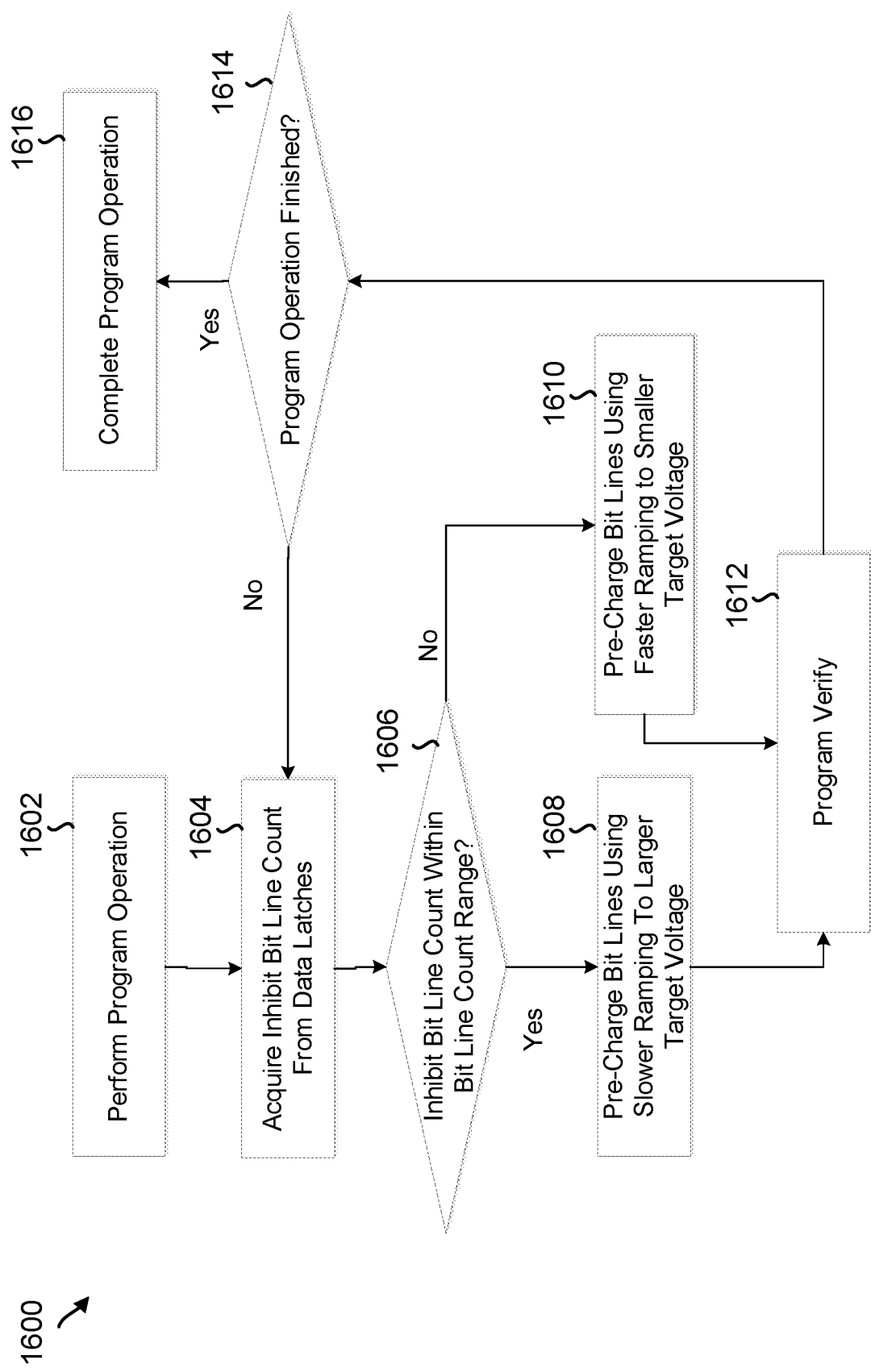
FIG. 16 is a flow chart illustrating a method for reducing peak current from bit line pre-charging at different ramp rates and target voltages based on data latch counts as performed by the storage device of FIG. 1.

FIG. 16 illustrates an example flow chart 1600 of a method for reducing peak current from bit line pre-charging at different ramp rates and target voltages based on data latch counts. For example, the method can be carried out in a storage device 102 such as the one illustrated in FIG. 1. Each of the steps in the flow chart can be controlled using the controller as described below (e.g. controller 123, 1302), or by some other suitable means.

As represented by block 1602, the controller may perform a program operation. For example, referring to FIGS. 3, 4, 12, and 13, the die 1304 may receive a program operation command from the controller 1302 indicating a selected word line for programming (e.g. word line 304, 408), selected bit lines (e.g. bit lines 306, 406, 1202, 1224), and un-selected bit lines (e.g. bit lines 306, 406, 608, 1222, 1242, 1308).

As represented by block 1604, an inhibit bit line count may be acquired from the data latches. For example, referring to FIG. 13, the data latch counter 1316 may acquire an inhibit bit line count from the data latches 1310 coupled to the bit lines 1308. For instance, referring also to FIG. 6, the data latch counter 1316 may receive outputs 616 (for example, INV_S) from each data latch 606, 1310 that result in activation of each bit line inhibit transistor 612 and pre-charging of each bit line 608 to VHSA. The total number of these outputs for all the bit lines may thus be stored in the data latch counter 1316 as the inhibit bit line count.

As represented by block 1606, the controller may determine whether the inhibit line count is outside or within a bit line count range. The bit line count range may be based on a number of planes in the memory (e.g. the more planes, the longer the range). If the inhibit bit line count is within the range, then as represented by block 1608, the controller may pre-charge the bit lines using a slower/smaller ramping rate to a larger target voltage, while if the inhibit bit line count is outside of the range, then as represented by block 1610, the controller may pre-charge the bit lines using a faster/larger ramping rate to a smaller target voltage. The ramp rates and target voltages may be stored in the memory (e.g. as VHSASLOW and VHSATGT parameters). For example, referring to FIGS. 6 and 13, if the inhibit bit line count is larger than the lower bound of the bit line count range and smaller than the upper bound of the bit line count range, the VHSASLOW and VHSATGT parameters may be set to a stored configuration which is more relaxed than a default configuration (e.g. 20 mA for a slower ramping rate and 90% VHSA for a larger target voltage, respectively, such as illustrated in chart 1320), and the bit lines 608, 1308 may be pre-charged accordingly as described above. On the other hand, if the inhibit bit line count acquired by the data latch counter 1316 is smaller than the lower bound of the bit line count range or larger than the upper bound of the bit line count range, the VHSASLOW and VHSATGT parameters may be set to the default configuration which is less relaxed than the stored configuration (e.g. 32 mA for a faster ramping rate and 75% VHSA for a smaller target voltage, respectively, such as illustrated in chart 1320), and the bit lines 608, 1308 may be pre-charged accordingly as described above.

As represented by block 1612, the controller may perform a program verification. For example, referring to FIGS. 3, 4, 5, 12, and 13, after pre-charging the un-selected bit lines (e.g. bit lines 306, 406, 608, 1222, 1242, 1308) and programming the cells 302 coupled to the selected bit lines (e.g. bit lines 306, 406, 1202, 1224) during a programming loop or programming phase, the controller may verify whether the cells 302 successfully transitioned into their intended program states (e.g. program states 504, 1342). For instance, the controller may read the programmed data from the cells into the sense amplifier 602 and data latch 606 to determine whether the cells are in their intended program state (e.g. the cells have an expected threshold voltage corresponding to the intended state). Following the program verify phase, the bit line voltages may be discharged and, if the cells are not fully programmed, data may be transferred to the data latches 606, 1310 for programming.

As represented by block 1614, the controller may determine whether the program operation is complete. For instance, the controller may determine whether the program verification at block 1612 failed for at least one of the cells on the page being programmed (e.g. not all of the cells have transitioned into their intended program state). If the program operation is not yet finished, then the process above may repeat for a subsequent programming loop beginning again at block 1604. Otherwise, if the program operation is finished, then as represented by block 1616, the controller may complete the program operation.

FIG. 17 illustrates an example flow chart 1700 of a method for reducing peak current from bit line pre-charging at different time periods and target voltages based on data latch counts. For example, the method can be carried out in a storage device 102 such as the one illustrated in FIG. 1. Each of the steps in the flow chart can be controlled using the controller as described below (e.g. controller 123, 1302), or by some other suitable means.

As represented by block 1702, the controller may perform a program operation. For example, referring to FIGS. 3, 4, 12, and 13, the die 1304 may receive a program operation command from the controller 1302 indicating a selected word line for programming (e.g. word line 304, 408), selected bit lines (e.g. bit lines 306, 406, 1202, 1224), and un-selected bit lines (e.g. bit lines 306, 406, 608, 1222, 1242, 1308).

As represented by block 1704, an inhibit bit line count may be acquired from the data latches. For example, referring to FIG. 13, the data latch counter 1316 may acquire an inhibit bit line count from the data latches 1310 coupled to the bit lines 1308. For instance, referring also to FIG. 6, the data latch counter 1316 may receive outputs 616 (for example, INV_S) from each data latch 606, 1310 that result in activation of each bit line inhibit transistor 612 and pre-charging of each bit line 608 to VHSA. The total number of these outputs for all the bit lines may thus be stored in the data latch counter 1316 as the inhibit bit line count.

As represented by block 1706, the controller may determine whether the inhibit line count is outside or within a bit line count range. The bit line count range may be based on a number of planes in the memory (e.g. the more planes, the longer the range). If the inhibit bit line count is within the range, then as represented by block 1708, the controller may pre-charge the bit lines to a larger target voltage at a later time (e.g. during the programming phase), while if the inhibit bit line count is outside of the range, then as represented by block 1710, the controller may pre-charge the bit lines to a smaller target voltage at an earlier time (e.g. during a channel clean phase prior to the programming phase). The different target voltages and time periods (earlier and later times) and may be stored in the memory (e.g. as VHSATGT and DYNAMIC_INH parameters). For example, referring to FIGS. 6 and 13, if the inhibit bit line count is larger than the lower bound of the bit line count range and smaller than the upper bound of the bit line count range, the DYNAMIC INC and VHSATGT parameters may be set to a stored configuration which is more relaxed than a default configuration (e.g. disabled for pre-charging at time 1334 and 90% VHSA for a larger target voltage, respectively, such as illustrated in chart 1330), and the bit lines 608, 1308 may be pre-charged accordingly as described above. On the other hand, if the inhibit bit line count acquired by the data latch counter 1316 is smaller than the lower bound of the bit line count range or larger than the upper bound of the bit line count range, the DYNAMIC_INH and VHSATGT parameters may be set to the default configuration which is less relaxed than the stored configuration (e.g. enabled for pre-charging at time 1332 and 75% VHSA for a smaller target voltage, respectively, such as illustrated in chart 1330), and the bit lines 608, 1308 may be pre-charged accordingly as described above.

As represented by block 1712, the controller may perform a program verification. For example, referring to FIGS. 3, 4, 5, 12, and 13, after pre-charging the un-selected bit lines (e.g. bit lines 306, 406, 608, 1222, 1242, 1308) and programming the cells 302 coupled to the selected bit lines (e.g. bit lines 306, 406, 1202, 1224) during a programming loop or programming phase, the controller may verify whether the cells 302 successfully transitioned into their intended program states (e.g. program states 504, 1342). For instance, the controller may read the programmed data from the cells into the sense amplifier 602 and data latch 606 to determine whether the cells are in their intended program state (e.g. the cells have an expected threshold voltage corresponding to the intended state). Following the program verify phase, the bit line voltages may be discharged and, if the cells are not fully programmed, data may be transferred to the data latches 606, 1310 for programming.

As represented by block 1714, the controller may determine whether the program operation is complete. For instance, the controller may determine whether the program verification at block 1712 failed for at least one of the cells on the page being programmed (e.g. not all of the cells have transitioned into their intended program state). If the program operation is not yet finished, then the process above may repeat for a subsequent programming loop beginning again at block 1704. Otherwise, if the program operation is finished, then as represented by block 1716, the controller may complete the program operation.

Accordingly, the storage device described in the present disclosure allows for reduction of peak and average current resulting from bit line pre-charging during the middle of a program operation. The data latch count control that allows for reduction of the current may be applied to bit lines coupled to cells on any string or word line. Depending on the setting of the lower and upper bounds of the bit line count range, as well as the setting of the VHSATGT, VHSASLOW, and DYNAMIC_INH parameters, a balance of write performance and current reduction may be achieved.

Although the examples described above with respect to data latch count control refer to TLCs, the data latch count control described herein may similarly apply to QLCs, PLCs, or other MLCs. The data latch count control may similarly be implemented in memories such as PCM and ReRAM that include multiple programming states (e.g. A-D) and inter-bit line capacitances as described above. Additionally, the lower and upper bound of the bit line count range may be customized to support different numbers of planes.

The various aspects of this disclosure are provided to enable one of ordinary skill in the art to practice the present invention. Various modifications to exemplary embodiments presented throughout this disclosure will be readily apparent to those skilled in the art, and the concepts disclosed herein may be extended to other magnetic storage devices. Thus, the claims are not intended to be limited to the various aspects of this disclosure, but are to be accorded the full scope consistent with the language of the claims. All structural and functional equivalents to the various components of the exemplary embodiments described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. No claim element is to be construed under the provisions of 35 U.S.C. § 112(f) in the United States, or an analogous statute or rule of law in another jurisdiction, unless the element is expressly recited using the phrase "means for" or, in the case of a method claim, the element is recited using the phrase "step for."

What is claimed is:

1. A storage device, comprising:
a memory comprising a plurality of bit lines; and
a controller configured to pre-charge the bit lines during a first time period when an inhibit bit line count acquired during a program operation is within a bit line count range, and to pre-charge the bit lines during a second time period different than the first time period when the inhibit bit line count is outside the bit line count range, wherein the memory comprises a plurality of planes, and wherein the bit line count range is based on a number of the planes.

2. The storage device of claim 1, wherein the program operation comprises a programming phase, wherein the first time period is during the programming phase, and wherein the second time period is prior to the programming phase.

3. The storage device of claim 2, wherein the memory includes a data latch that receives data during the second time period which is programmed subsequently during the programming phase.

4. The storage device of claim 1, wherein the controller is further configured to pre-charge the bit lines to a first target voltage when the inhibit bit line count is within the bit line count range, and to pre-charge the bit lines to a second target voltage different than the first target voltage when the inhibit bit line count is outside the bit line count range.

5. The storage device of claim 4, wherein the first target voltage is larger than the second target voltage.

6. The storage device of claim 4, wherein the controller is further configured to store the first target voltage in the memory.

7. A storage device, comprising:

a memory comprising a plurality of bit lines; and a controller configured to pre-charge the bit lines to a first target voltage when an inhibit bit line count acquired during a program operation is within a bit line count range, and to pre-charge the bit lines to a second target voltage different than the first target voltage when the inhibit bit line count is outside the bit line count range, wherein the bit lines are pre-charged during one of a plurality of time periods based on the inhibit bit line count, wherein the memory comprises a plurality of planes, and wherein an upper bound of the bit line count range is based on a number of the planes.

8. The storage device of claim 7, wherein the first target voltage is larger than the second target voltage.

9. The storage device of claim 7, wherein the bit lines are pre-charged during a first one of the time periods when the inhibit bit line count is within the bit line count range, and wherein the bit lines are pre-charged during a second one of the time periods when the inhibit bit line count is outside the bit line count range.

10. The storage device of claim 9, wherein the program operation comprises a programming phase, wherein a first one of the time periods is during the programming phase, and wherein a second one of the time periods is prior to the programming phase.

11. The storage device of claim 10, wherein the memory includes a data latch that receives data during the second one of the time periods for programming subsequently during the programming phase.

12. The storage device of claim 7, wherein the controller is further configured to store a dynamic inhibit enable indicator associated with the plurality of time periods in the memory.

13. A storage device, comprising:

a memory comprising a plurality of bit lines; and a controller configured to pre-charge the bit lines during a first time period to a first target voltage when an inhibit bit line count acquired during a program operation is within a bit line count range, and to pre-charge the bit lines during a second time period different than the first time period to a second target voltage smaller than the first target voltage when the inhibit bit line count is outside the bit line count range, wherein the memory comprises a plurality of planes, and the bit line count range increases with a number of the planes.

14. The storage device of claim 13, wherein the controller is further configured to store the first target voltage and the second target voltage in the memory.

15. The storage device of claim 13, wherein the controller is further configured to store a dynamic inhibit enable indicator associated with the first time period and the second time period in the memory.

16. The storage device of claim 13, wherein the program operation comprises a programming phase and a program verify phase following the programming phase, wherein the inhibit bit line count is acquired after the program verify phase.

17. The storage device of claim 13, wherein the program operation comprises a plurality of program verify phases, and wherein the inhibit bit line count is acquired after each of the program verify phases.

* * * * *